US010692991B2

(12) United States Patent
Chanemougame et al.

(10) Patent No.: US 10,692,991 B2
(45) Date of Patent: Jun. 23, 2020

(54) GATE-ALL-AROUND FIELD EFFECT TRANSISTORS WITH AIR-GAP INNER SPACERS AND METHODS

(71) Applicant: GLOBALFOUNDRIES INC., Grand Cayman (KY)

(72) Inventors: Daniel Chanemougame, Niskayuna, NY (US); Julien Frougier, Albany, NY (US); Ruilong Xie, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 20 days.

(21) Appl. No.: 16/123,160

(22) Filed: Sep. 6, 2018

(65) Prior Publication Data
US 2020/0083352 A1 Mar. 12, 2020

(51) Int. Cl.
*H01L 29/66* (2006.01)
*H01L 29/78* (2006.01)
(Continued)

(52) U.S. Cl.
CPC .... *H01L 29/66553* (2013.01); *H01L 29/0653* (2013.01); *H01L 29/0673* (2013.01);
(Continued)

(58) Field of Classification Search
CPC ............. H01L 29/0673; H01L 29/0653; H01L 29/66553
See application file for complete search history.

(56) References Cited

U.S. PATENT DOCUMENTS 7,839,605 B2 11/2010 Parker
8,421,890 B2 4/2013 Benkley, III
(Continued)

FOREIGN PATENT DOCUMENTS

WO 2018203170 A1 11/2018

OTHER PUBLICATIONS

Disclosed Anonymously, "Inner Spacer Formation Using a Deposition-Etch Technique for Beyond-7nm Nanosheet CPP Scaling", www.IP.com, IPCOM000253603D, Apr. 16, 2018, pp. 1-8.
(Continued)

*Primary Examiner* — Wael M Fahmy
*Assistant Examiner* — Sarah K Salerno
(74) *Attorney, Agent, or Firm* — Gibb & Riley, LLC; Anthony J. Canale

(57) ABSTRACT

Disclosed are structures including a gate-all-around field effect transistor (GAAFET) with air-gap inner spacers. The GAAFET includes a stack of nanoshapes that extend laterally between source/drain regions, a gate that wraps around a center portion of each nanoshape, and a gate sidewall spacer on external sidewalls of the gate. The GAAFET also includes air-gap inner spacers between the gate and the source/drain regions. Each air-gap inner spacer includes: two vertical sections within the gate sidewall spacer on opposing sides of the stack and adjacent to a source/drain region; and horizontal sections below the nanoshapes and extending laterally between the vertical sections. Also discloses are methods of forming the structures and the method include forming preliminary inner spacers in inner spacer cavities prior to source/drain region formation. After source/drain regions are formed, the preliminary inner spacers are removed and the cavities are sealed off, thereby forming the air-gap inner spacers.

7 Claims, 36 Drawing Sheets

(51) Int. Cl.
*H01L 29/06* (2006.01)
*H01L 29/423* (2006.01)
*H01L 21/311* (2006.01)
*H01L 21/3065* (2006.01)

(52) U.S. Cl.
CPC .... *H01L 29/42392* (2013.01); *H01L 29/6653* (2013.01); *H01L 29/6681* (2013.01); *H01L 29/7853* (2013.01); *H01L 21/3065* (2013.01); *H01L 21/31111* (2013.01)

(56) References Cited

U.S. PATENT DOCUMENTS

| | | |
|---|---|---|
| 9,064,943 B1 | 6/2015 | Anderson et al. |
| 9,508,796 B2 | 11/2016 | Kim et al. |
| 9,508,829 B1 | 11/2016 | Cheng et al. |
| 9,691,850 B2 | 6/2017 | Cheng et al. |
| 9,716,158 B1 | 7/2017 | Cheng et al. |
| 9,881,998 B1 | 1/2018 | Cheng et al. |
| 9,923,055 B1 | 3/2018 | Cheng et al. |
| 9,941,352 B1 | 4/2018 | Bi et al. |
| 10,014,390 B1 | 7/2018 | Bouche et al. |
| 10,170,584 B2 | 1/2019 | Guillom et al. |
| 10,211,307 B2 | 2/2019 | Ching et al. |
| 10,269,983 B2 | 4/2019 | Frougier et al. |
| 2016/0190312 A1 | 6/2016 | Zhang et al. |
| 2018/0047834 A1 | 2/2018 | Chao et al. |
| 2018/0240664 A9 | 8/2018 | Varadarajan et al. |
| 2018/0277656 A1 | 9/2018 | Chao et al. |
| 2018/0331232 A1 | 11/2018 | Frougier et al. |
| 2019/0058052 A1 | 2/2019 | Frougier et al. |
| 2019/0237559 A1 | 8/2019 | Cheng et al. |

OTHER PUBLICATIONS

Loubet et al., "Stacked Nanosheet Gate-All-Around Transistor to Enable Scaling Beyond FinFET," Symposium on VLSI Technology Digest of Technical Papers, 2017, pp. T230-T231.

Disclosed Anonymously, "Dual Stage Inner Spacer Formation for Nanosheet-FET," IPCOM000253328D, www.ip.com, Mar. 22, 2018, pp. 1-6.

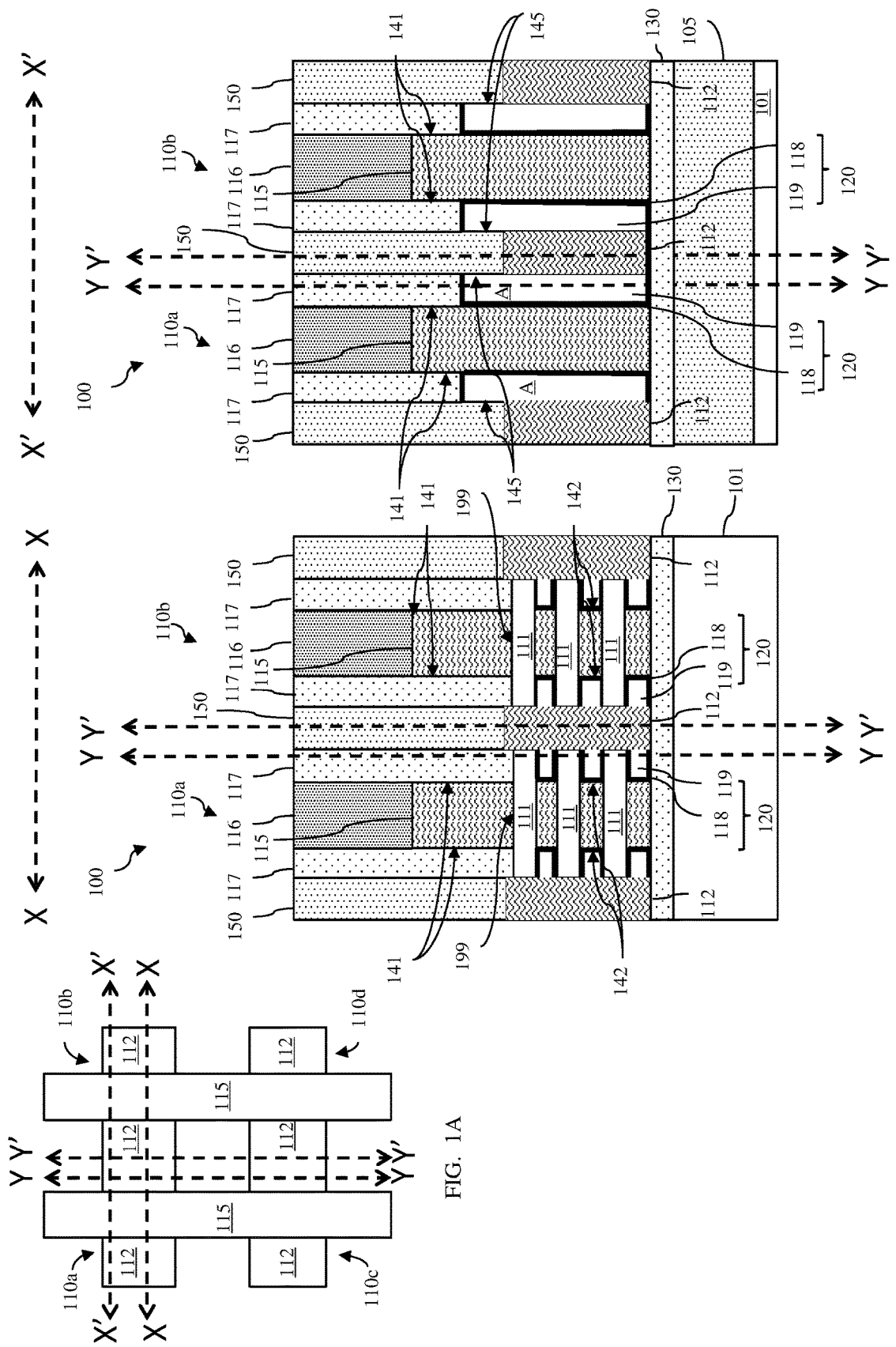

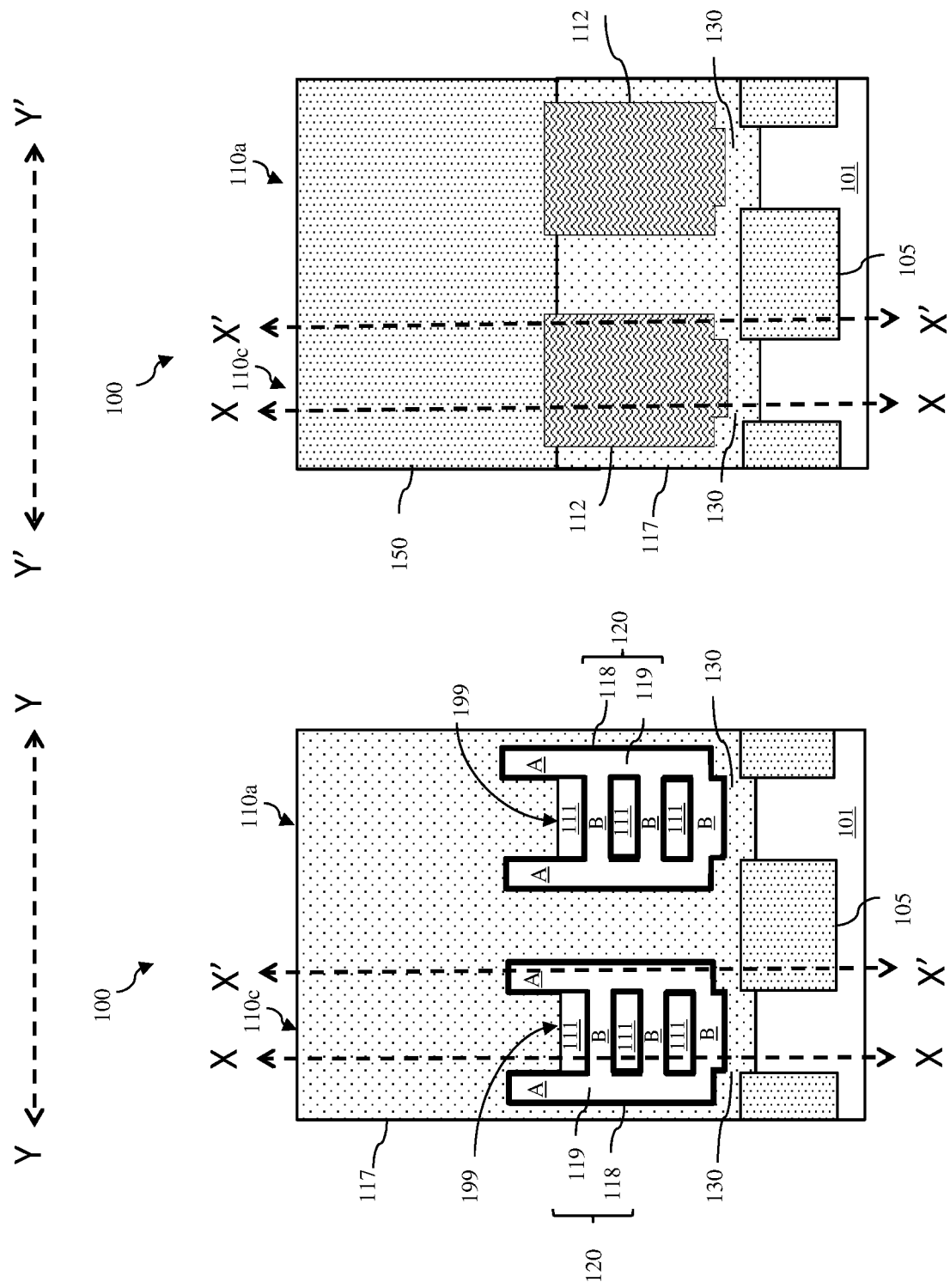

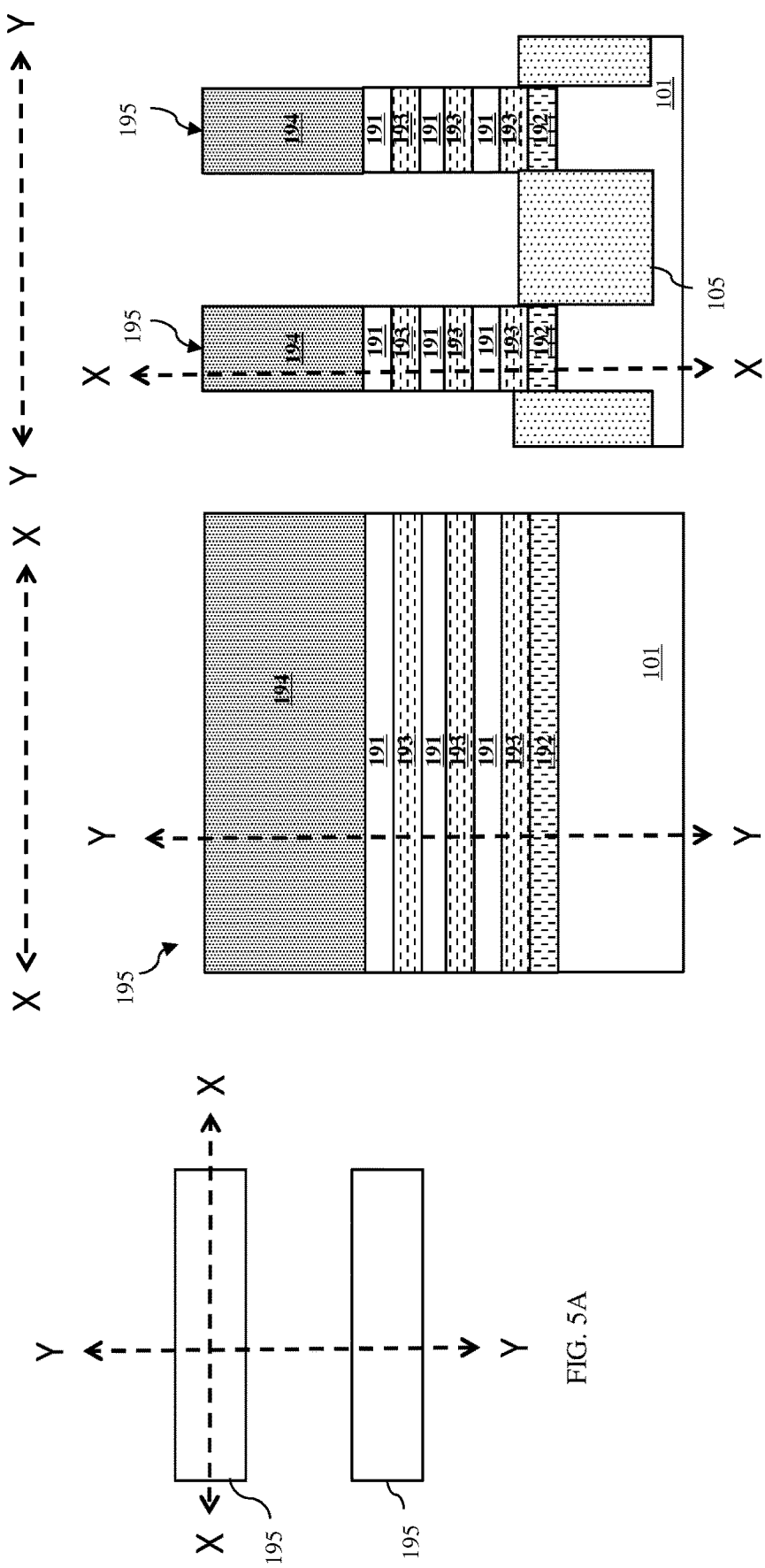

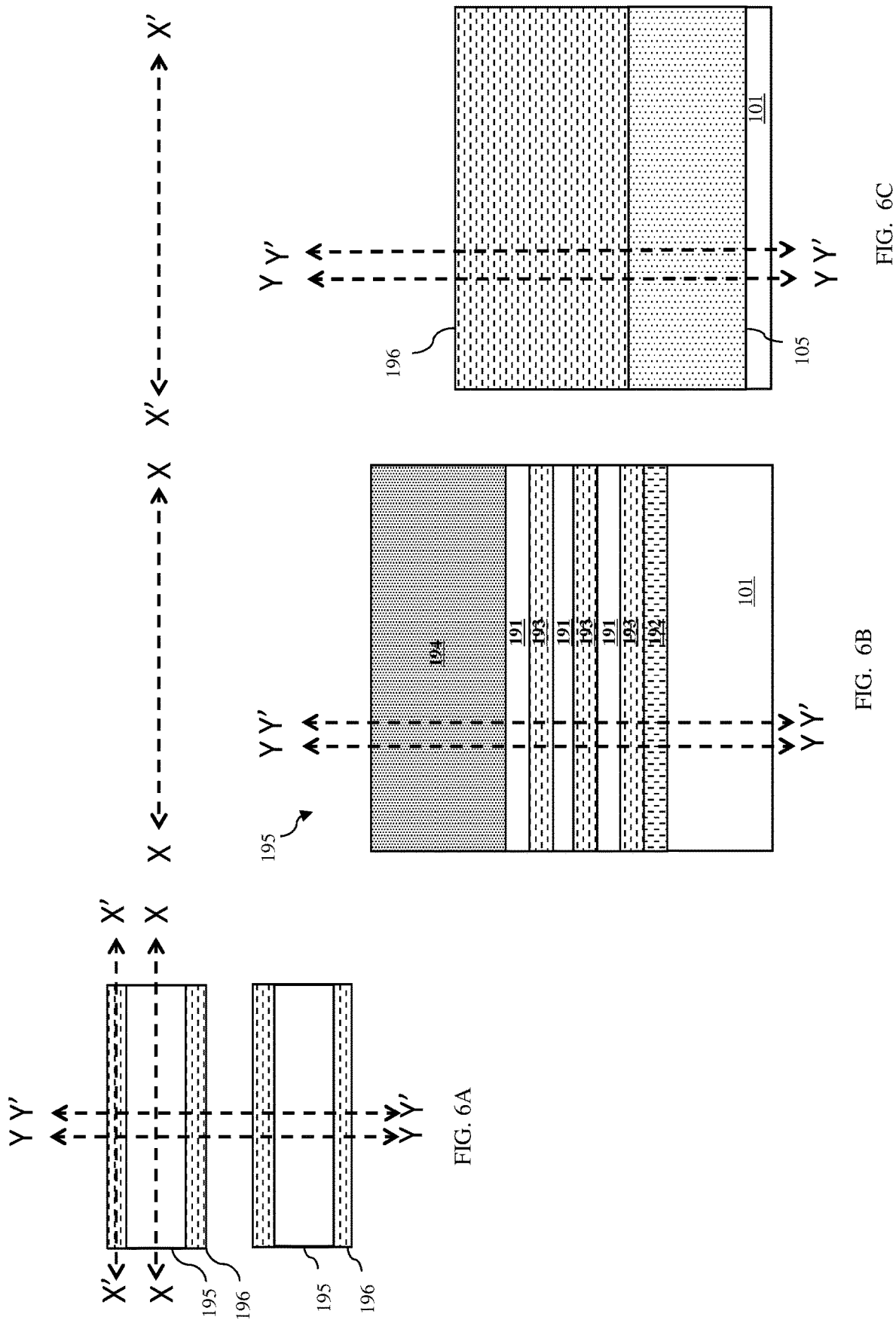

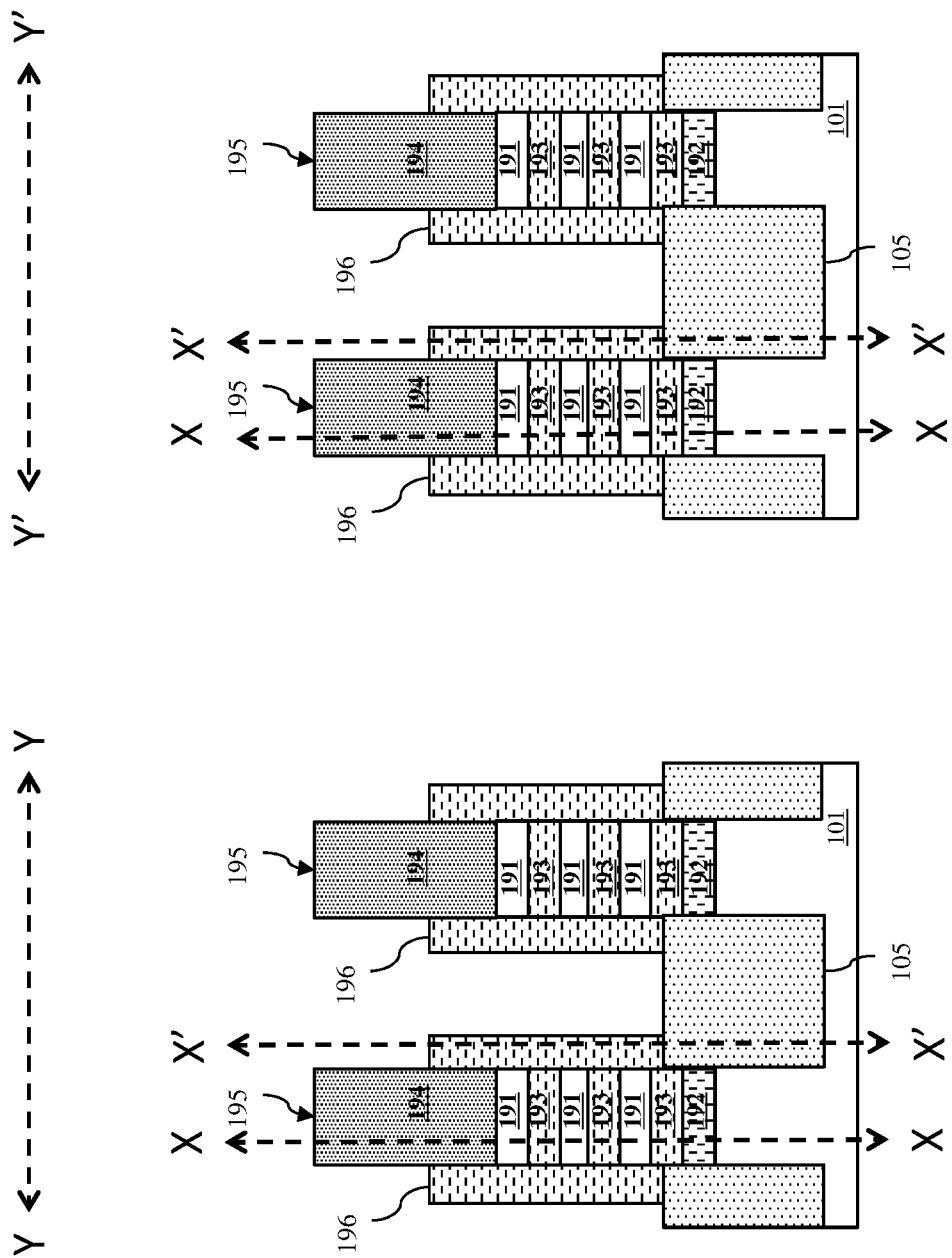

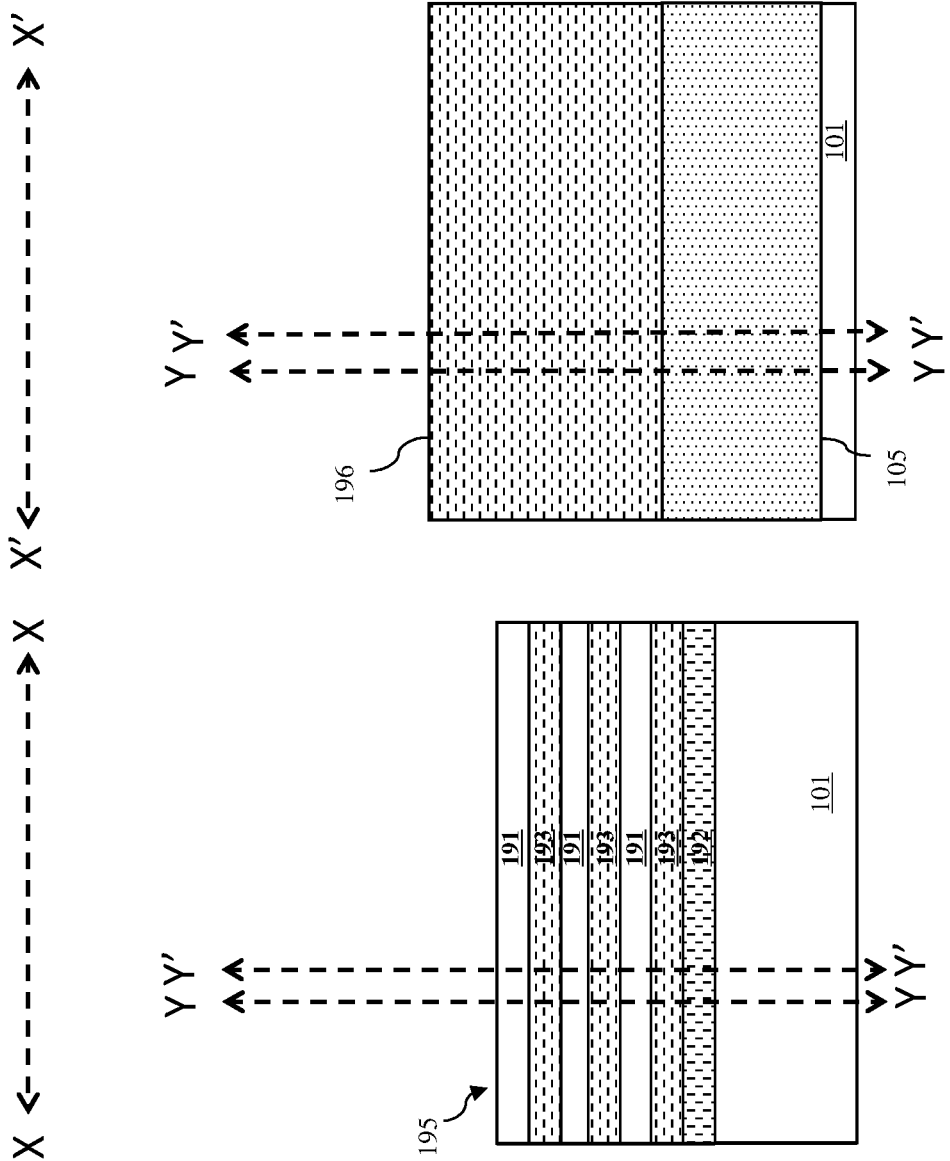

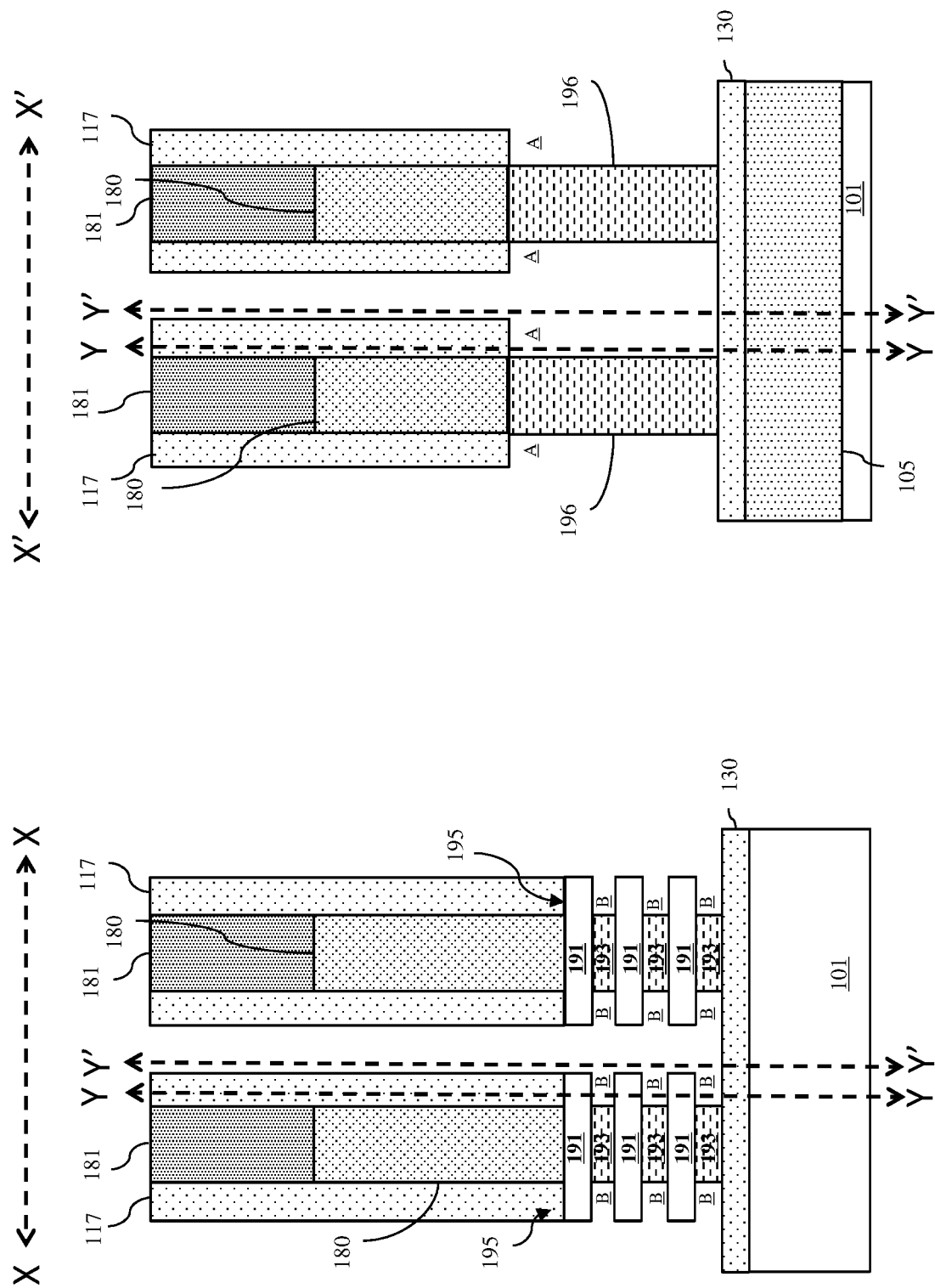

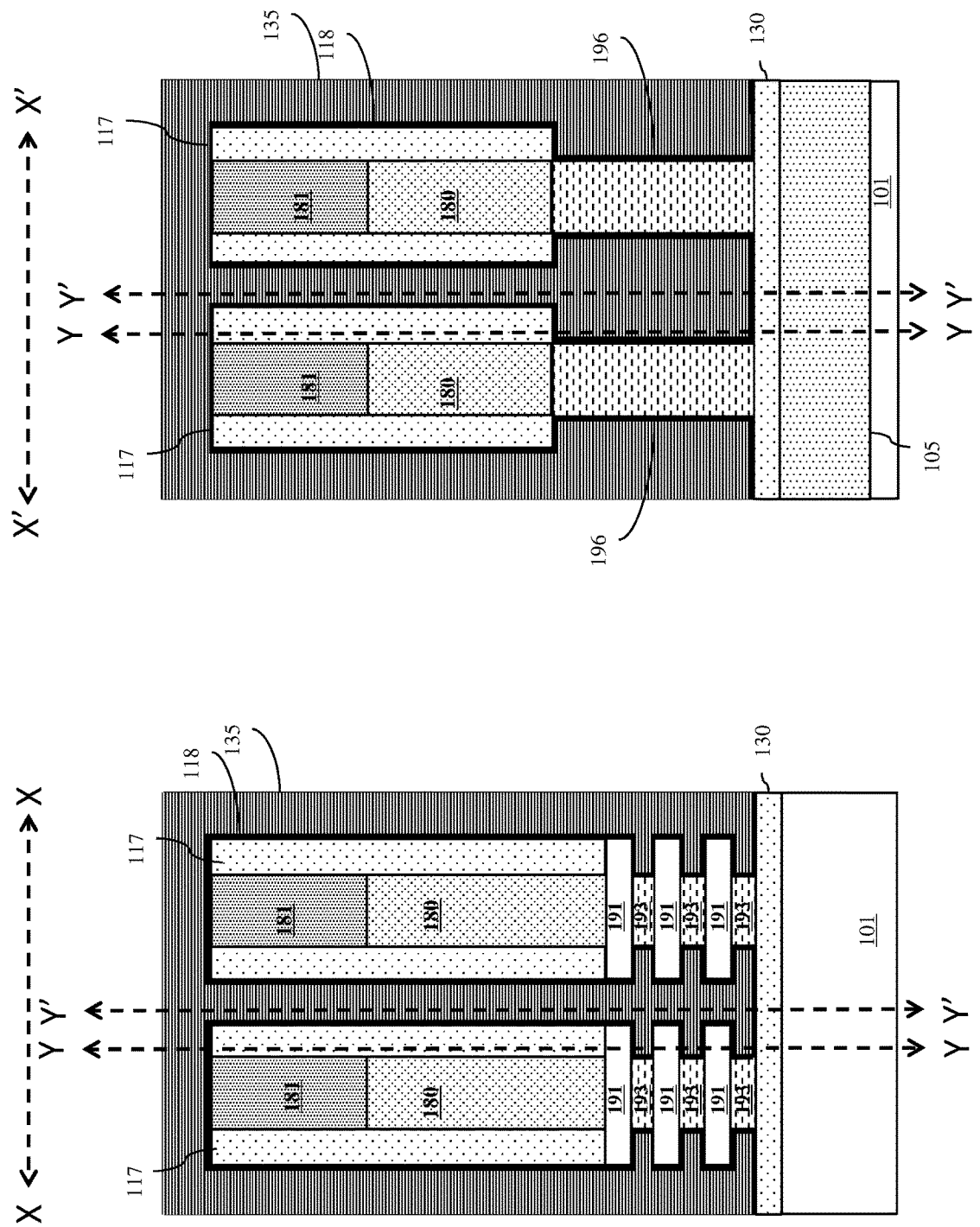

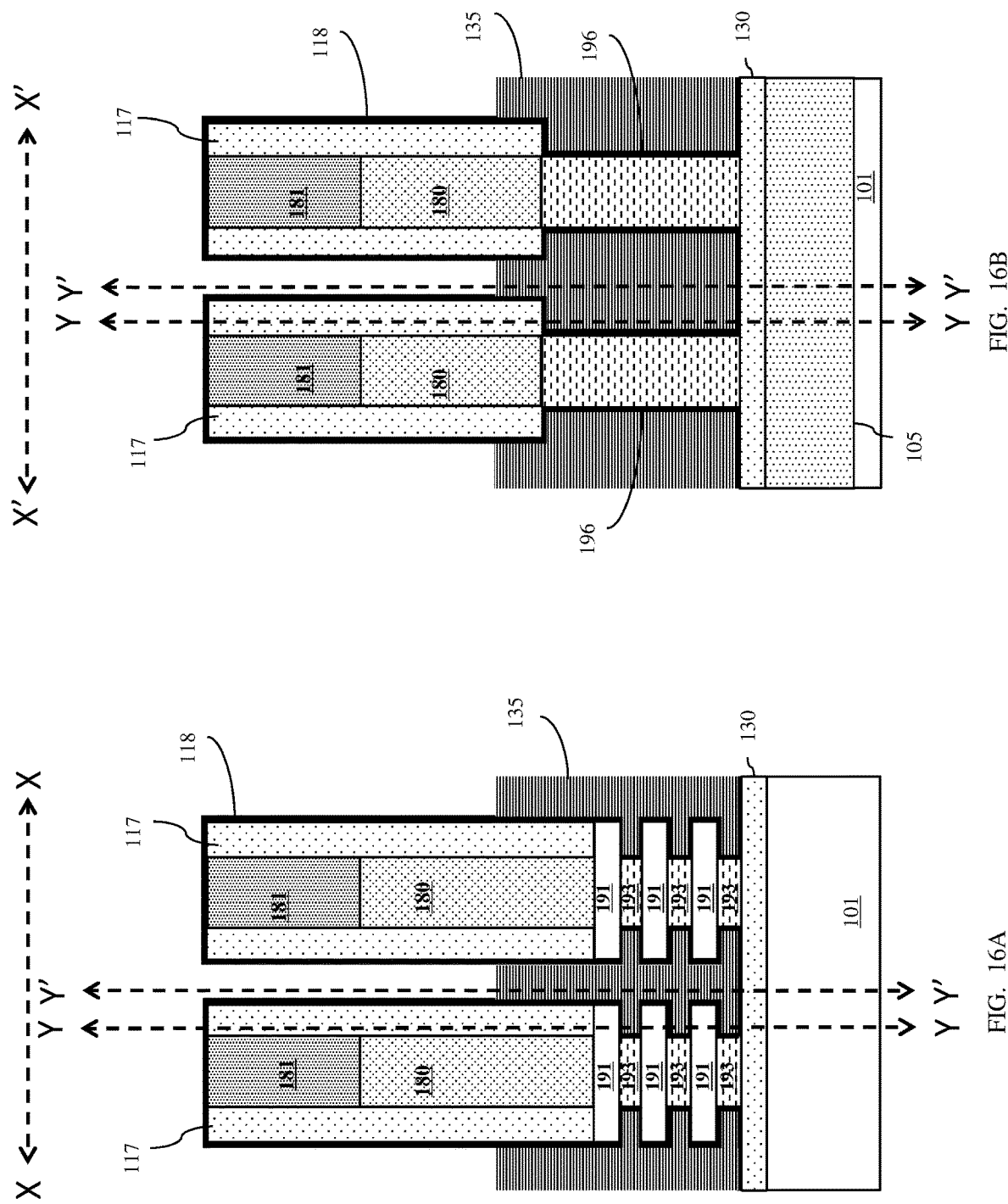

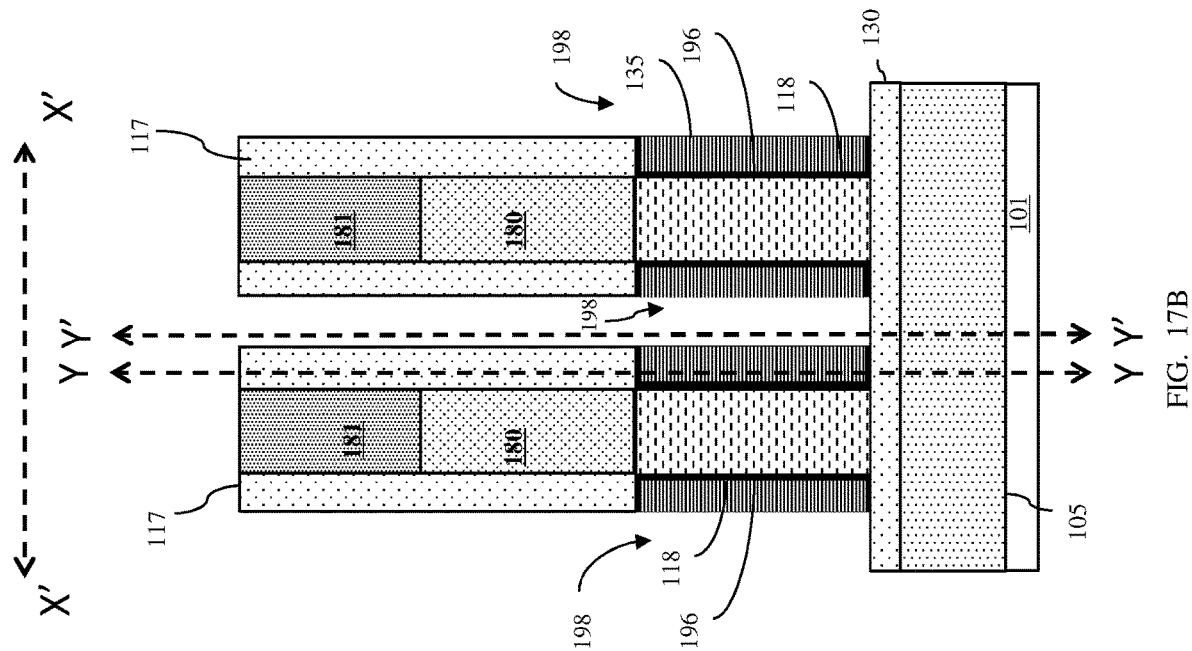
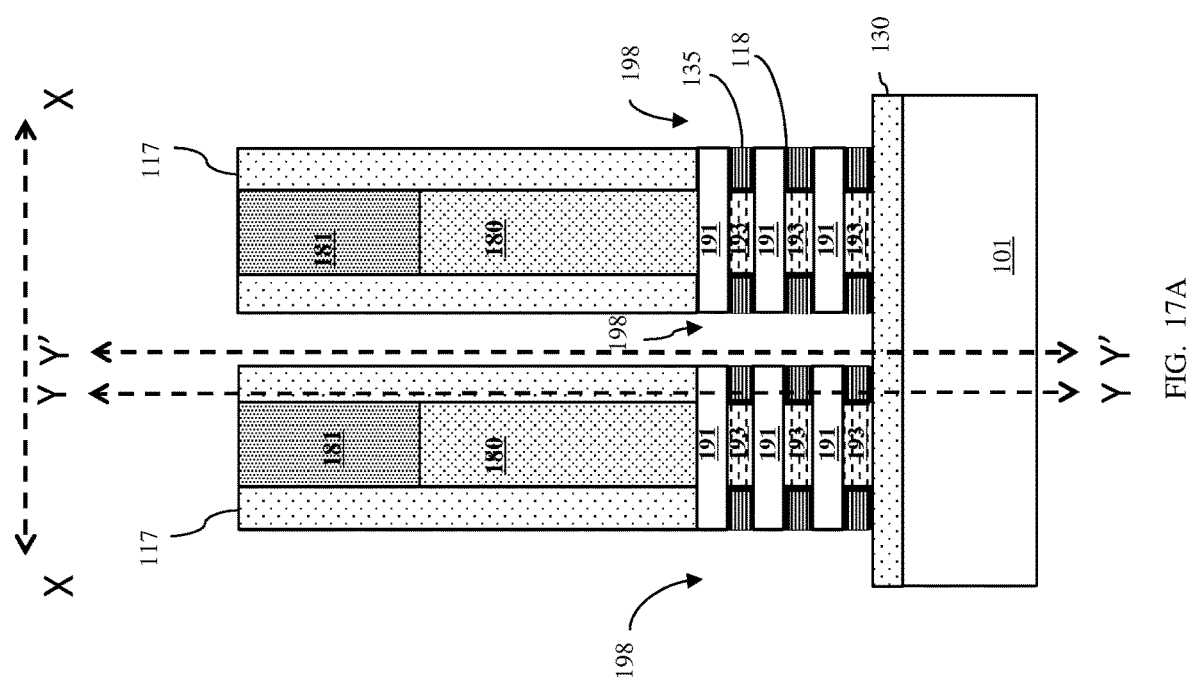
FIG. 17B
FIG. 17A

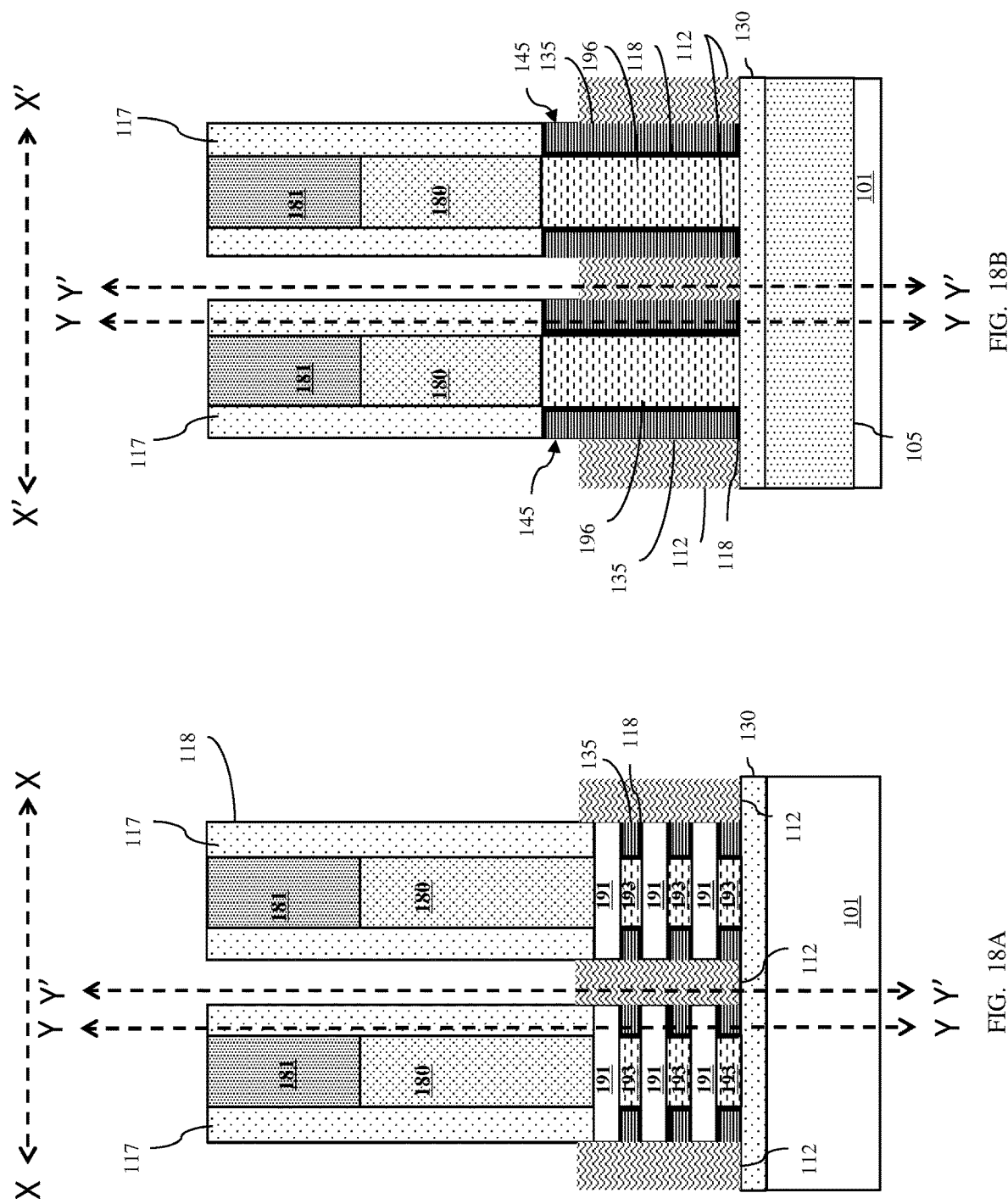

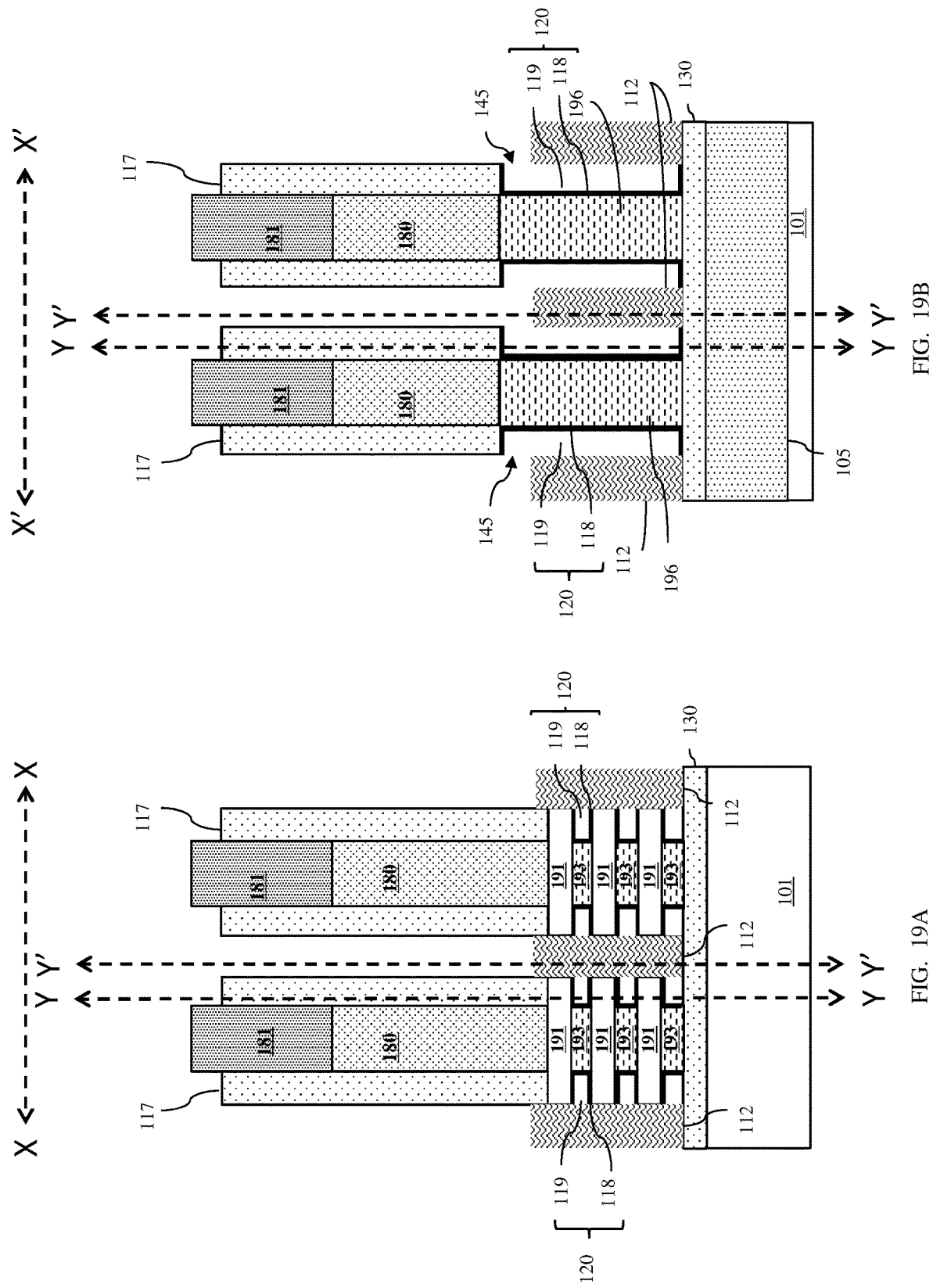

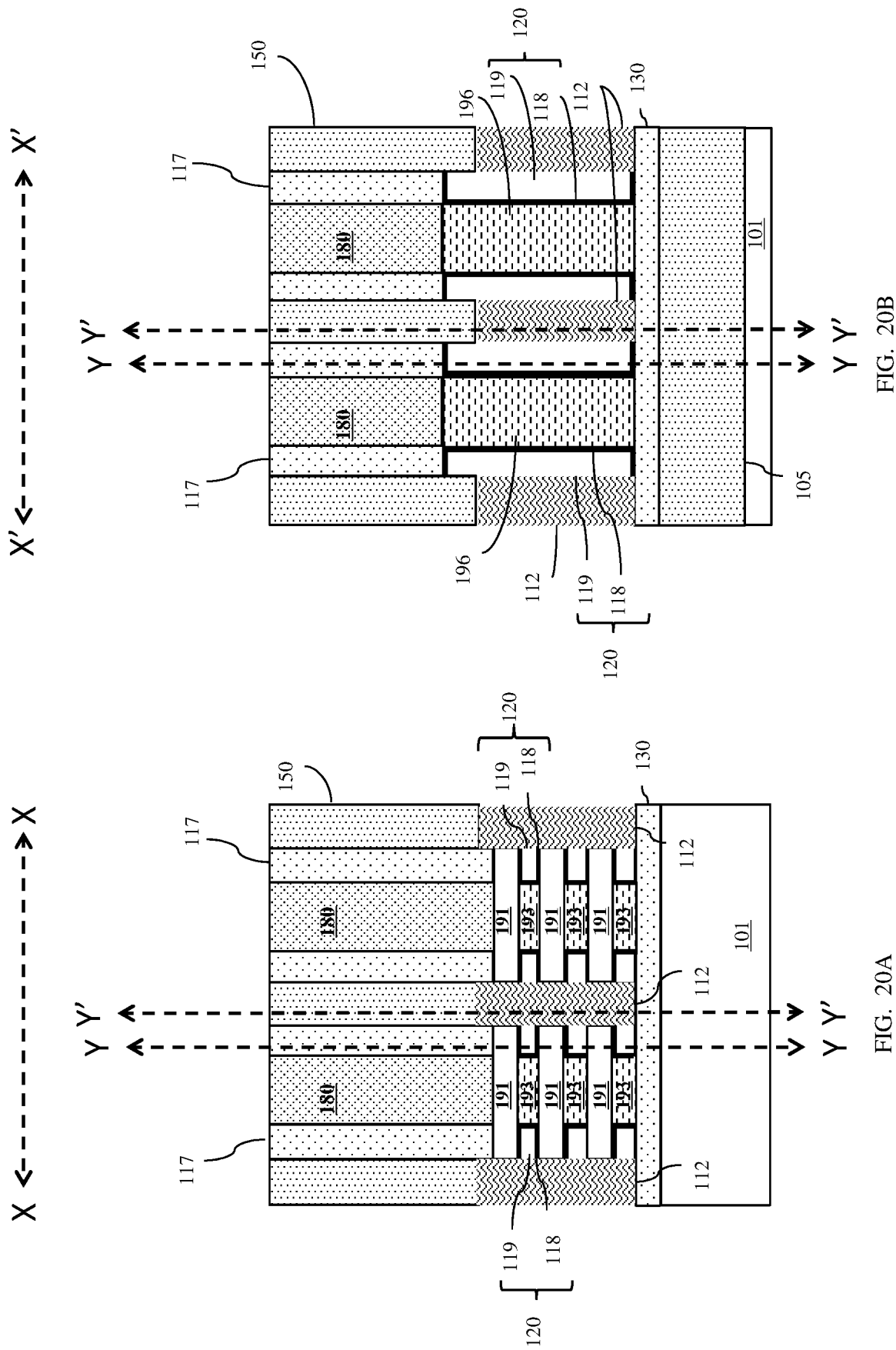

GATE-ALL-AROUND FIELD EFFECT TRANSISTORS WITH AIR-GAP INNER SPACERS AND METHODS

BACKGROUND

Field of the Invention

The present invention relates to gate-all-around field effect transistors (GAAFETs) and, more particularly, to GAAFETs with air-gap inner spacers and methods of forming the GAAFETS.

Description of Related Art

Integrated circuit (IC) design decisions are often driven by device performance, scalability, and manufacturability. For example, recently, to improve device drive current and electrostatics and to allow for further device size scaling, gate-all-around field effect transistors (GAAFETs) (e.g., nanowire-type GAAFETs or nanosheet-type GAAFETs) were developed. A GAAFET includes elongated semiconductor nanoshape(s) (e.g., nanowires or nanosheets), which extend laterally between source/drain regions, and a gate structure, which wraps around (i.e., which is adjacent to the top, bottom and opposing sides) of the center portions of the nanoshape(s) such that the nanoshape(s) function as channel region(s). In such GAAFETs spacers, including a gate sidewall spacer and inner spacers, provide electrical isolation between the gate and the adjacent source/drain regions. Specifically, "a gate sidewall spacer" refer to a spacer that is positioned laterally adjacent to the external sidewalls of the gate structure and "inner spacers" refer to those spacers that are positioned laterally between the source/drain regions and opposing internal sidewalls of the gate, respectively (i.e., adjacent to the end portions of the nanoshape(s)). However, with continued device size scaling, conventional GAAFET processing techniques may no longer be suitable and, particularly, may no longer allow for proper formation and functioning of the inner spacers.

SUMMARY

In view of the foregoing, disclosed herein are semiconductor structures that include one or more gate-all-around field effect transistors (GAAFETs) with air-gap inner spacers that minimize parasitic gate to source/drain capacitance. Also disclosed herein are methods of forming the above-described semiconductor structures and these methods include a technique for forming the air-gap inner spacers that avoids violating any minimum gap requirements when etching spacer material and, thus, facilitates device size scaling.

More particularly, disclosed herein are semiconductor structures that include a semiconductor substrate and at least one gate-all-around field effect transistor (GAAFET) on the semiconductor substrate. The GAAFET can include source/drain regions and a stack of elongated semiconductor nanoshapes that extend laterally between the source/drain regions. The stack of elongated semiconductor nanoshapes can include, for example, two or more semiconductor nanoshapes (e.g., nanowires or nanosheets) that are parallel, stacked one above the other, and physically separated. The GAAFET can further include a gate, which wraps around the center portion only of each nanoshape, and a gate sidewall spacer positioned laterally adjacent to external sidewalls of the gate, wherein end portions of each nanoshape extend laterally beyond opposing internal sidewalls of the gate to the source/drain regions, respectively. The GAAFET can further have air-gap inner spacers between the source/drain regions and the gate. Specifically, each air-gap inner spacer can have a pair of vertical air-gap sections within the gate sidewall spacer on opposing sides of the stack of nanoshapes at an end adjacent to a source/drain region. Each air-gap inner spacer can further have multiple horizontal air-gap sections, which are below the nanoshapes, respectively, and which extend laterally between the pair of vertical air-gap sections such that they are between the source/drain region and an internal sidewall of the gate.

Also disclosed herein are methods of forming the above-described semiconductor structures. Generally, the methods can include providing a semiconductor substrate and forming, on the semiconductor substrate, at least one gate-all-around field effect transistor (GAAFET). The process of forming the GAAFET can forming source/drain recesses in a multi-layer body on opposing sides of a sacrificial gate, wherein the multi-layer body comprises alternating layers of different semiconductor material and is laterally surrounded by a sacrificial sidewall spacer and wherein the sacrificial gate has a gate sidewall spacer and traverses the multi-layer body and the sacrificial sidewall spacer. Following formation of the source/drain recesses exposed surfaces of one of the different semiconductor materials of the multi-layer body and exposed surfaces of the sacrificial sidewall spacer within each source/drain recess can be laterally etched to form inner spacer cavities. Preliminary inner spacers can be formed in the inner spacer cavities and source/drain regions can then be formed in the source/drain recesses. After source/drain regions are formed, the preliminary inner spacers can be selectively removed from the inner spacer cavities and interlayer dielectric material can be deposited so as to seal off the inner spacer cavities, thereby creating air-gap inner spacers. Additional process steps can then be performed in order to complete the GAAFET structure.

More specifically, the methods can include providing a semiconductor substrate and forming, on the substrate, a gate-all-around field effect transistor (GAAFET). Furthermore, during the GAAFET formation process, air-gap inner spacers can be formed so as to minimize parasitic gate to source/drain capacitance.

To form the GAAFET, a multi-layer body can be formed on the semiconductor substrate. This multi-layer body can include alternating layers of different semiconductor materials (e.g., silicon germanium and silicon). After the multi-layer body is formed, a sacrificial sidewall spacer (e.g., a silicon germanium sacrificial sidewall spacer) can be formed on the sidewalls of the multi-layer body.

A sacrificial gate can further be formed so as to traverse the multi-layer body and the sacrificial sidewall spacer. Then, a gate sidewall spacer can be formed adjacent to the external sidewalls of the sacrificial gate.

After the gate sidewall spacer is formed on the sacrificial gate, source/drain recesses can be formed in the multi-layer body adjacent to the gate sidewall spacer on either side of the sacrificial gate. These source/drain recesses will expose vertical surfaces of the alternating layers of the different semiconductor materials in the remaining portion of the multi-layer body under the sacrificial gate and the gate sidewall spacer. They will also expose vertical surfaces of the sacrificial sidewall spacer.

At this point in the processing, the exposed vertical surfaces of one of the different semiconductor materials of the multi-layer body (e.g., the silicon germanium) and also the exposed vertical surfaces of the sacrificial sidewall spacer within each source/drain recess can be laterally etched to form inner spacer cavities for the air-gap inner spacers.

Preliminary inner spacers can be formed in the inner spacer cavities. For example, the inner spacer cavities can be lined with a dielectric liner and then filled by depositing a sacrificial fill material. Any of the sacrificial fill material and the dielectric liner that is deposited in areas outside the inner spacer cavities can be selectively removed.

Next, source/drain regions can be formed in the source/drain recesses such that at least an upper portion of the sacrificial fill material within the inner spacer cavities remains exposed. After the source/drain regions are formed, the sacrificial fill material can be selectively removed from the inner spacer cavities. Then, interlayer dielectric material can be deposited so as to seal off the inner spacer cavities, thereby creating the air-gap inner spacers.

After the interlayer dielectric material is deposited, additional process steps can be performed in order to complete the GAAFET structure. As a result of the above-described processing, the GAAFET will have air-gap inner spacers between the gate and the source/drain regions, respectively. Each air-gap inner spacer will have a pair of vertical air-gap sections within the gate sidewall spacer on opposing sides of a stack of nanoshapes at an end adjacent to one of the source/drain regions. Each air-gap inner spacer will further have multiple horizontal air-gap sections, which are below the nanoshapes, respectively, and which extend laterally between the pair of vertical air-gap sections such that they are between the source/drain region and an internal sidewall of the gate.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 1A is a layout diagram of a semiconductor structure with four gate-all-around field effect transistors (GAAFETs) arranged columns and rows of two and FIGS. 1B, 1C, 1D and 1E are different cross-section diagrams of this semiconductor structure, formed according to the method of FIG. 3 (below);

FIG. 5A is a top view and FIGS. 5B-5C are different cross-section diagrams of a partially completed structure formed according to the method of FIG. 3;

FIG. 6A is a top view and FIGS. 6B-6E are different cross-section diagrams of a partially completed structure formed according to the method of FIG. 3;

FIGS. 7A-7D are different cross-section diagrams of a partially completed structure formed according to the method of FIG. 3;

FIGS. 14A-14D are different cross-section diagrams of a partially completed structure formed according to the method of FIG. 3;

FIGS. 15A-15D are different cross-section diagrams of a partially completed structure formed according to the method of FIG. 3;

FIGS. 16A-16D are different cross-section diagrams of a partially completed structure formed according to the method of FIG. 3;

FIGS. 17A-17D are different cross-section diagrams of a partially completed structure formed according to the method of FIG. 3;

FIGS. 18A-18D are different cross-section diagrams of a partially completed structure formed according to the method of FIG. 3;

FIGS. 19A-19D are different cross-section diagrams of a partially completed structure formed according to the method of FIG. 3;

FIGS. 20A-20D are different cross-section diagrams of a partially completed structure formed according to the method of FIG. 3.

DETAILED DESCRIPTION

Figure 2:
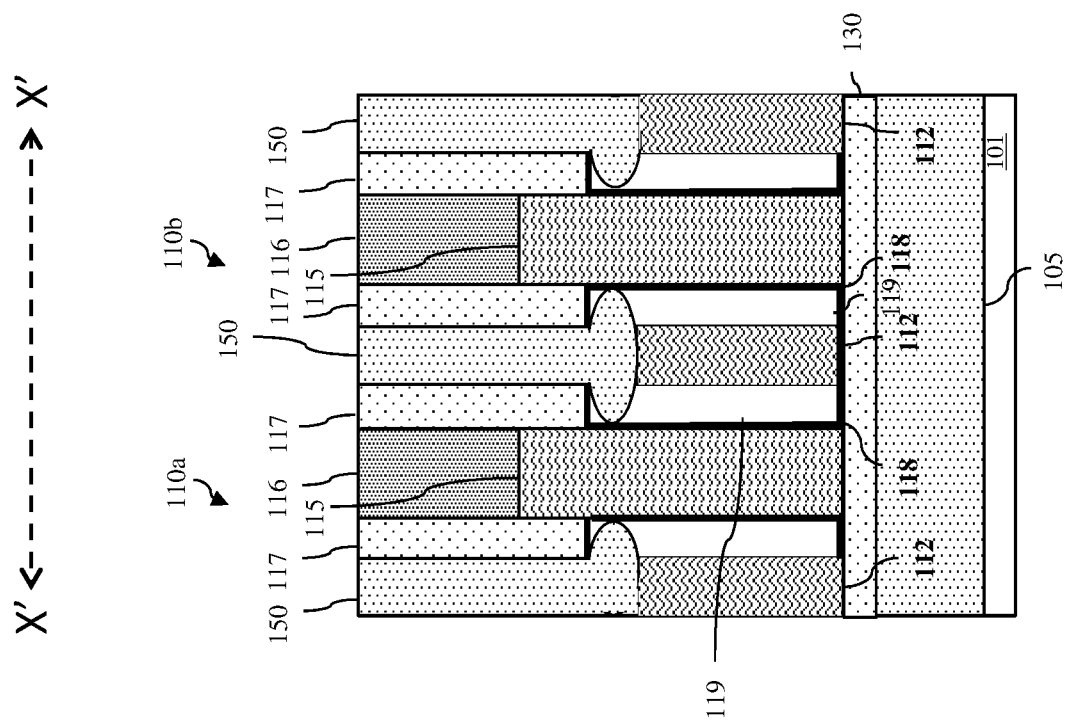
FIG. 2 is a cross-section diagram to an alternative structure to that shown in FIG. 1B.

As mentioned above, to improve device drive current and electrostatics and to allow for further device size scaling, gate-all-around field effect transistors (GAAFETs) (e.g., nanowire-type GAAFETs or nanosheet-type GAAFETs) were developed. A GAAFET includes elongated semiconductor nanoshape(s) (e.g., nanowires or nanosheets), which extend laterally between source/drain regions, and a gate structure, which wraps around (i.e., which is adjacent to the top, bottom and opposing sides) of the center portions of the nanoshape(s) such that the nanoshape(s) function as channel region(s). In such GAAFETs, spacers, including a gate sidewall spacer and inner spacers, provide electrical isolation between the gate and the adjacent source/drain regions. Specifically, a "gate sidewall spacer" refers to a spacer that is positioned laterally adjacent to external sidewalls of the gate structure and "inner spacers" refer to those spacers that are positioned laterally between the source/drain regions and opposing internal sidewalls of the gate, respectively (i.e., adjacent to the end portions of the nanoshape(s)). However, with continued device size scaling, conventional GAAFET processing techniques may no longer be suitable and, particularly, may no longer allow for proper formation of the inner spacers.

More specifically, current GAAFET processing techniques typically begin with a semiconductor substrate. Alternating layers of silicon germanium and silicon are formed (e.g., by epitaxial deposition) on the semiconductor substrate and a rectangular-shaped multi-layer semiconductor body (e.g., a multi-layer semiconductor fin) is patterned from these alternating layers. A sacrificial gate is formed on a first portion of the multi-layer semiconductor body with second portions extending laterally beyond the sacrificial gate.

A gate sidewall spacer is formed on the sacrificial gate. Then, exposed second portions of the multi-layer semiconductor body are etched away to form source/drain recesses and exposed silicon germanium surfaces of the remaining first portion of the multi-layer semiconductor body in the source/drain recesses are laterally etched to form divots. Inner spacers are formed in these divots, for example, by conformally depositing a thin spacer material and performing a selective isotropic etch process (e.g., a wet etch process) to remove any of the spacer material that is outside the divots. Next, epitaxial source/drain regions are grown laterally from exposed silicon surfaces of the remaining first portion of the multi-layer semiconductor body in the source/drain recesses. After the source/drain regions are formed, the sacrificial gate can be selectively removed, thereby forming a gate opening and exposing the top and opposing sidewalls of the remaining first portion of the multi-layer semiconductor body. A selective isotropic etch process can be performed in order to remove the silicon germanium layers from the remaining first portion of the multi-layer semiconductor body, thereby forming a stack of elongated silicon nanoshapes. Depending upon the number of alternating layers of silicon and silicon germanium contained within the multi-layer semiconductor body, this stack of elongated silicon nanoshapes can include, for example, one or more silicon nanoshapes (e.g., nanowires or nanosheets) that are parallel, stacked one above the other, and physically separated.

For purposes of this disclosure, an elongated nanoshape (NS) refers to a feature having a length that is relatively long as compared to its thickness (also referred to herein as its height) and/or its width (also referred to herein as its depth) and further having its thickness and/or its width dimensions constrained to tens of nanometers or less (i.e., constrained to 100 nm or less). Such elongated nanoshapes include nanowires, nanosheets and nanofins. Specifically, a nanowire (NW) refers to a nanoshape having both its thickness (or height) and its width dimensions constrained to tens of nanometers or less (i.e., constrained to 100 nm or less) and preferably having the ratio of the thickness dimension to the width dimension being, for example, approximately 1 to 1. A nanosheet refers to a nanoshape having its thickness dimension (or height) constrained to tens of nanometers or less (i.e., constrained to 100 nm or less), having its width dimension above 100 nm, and having the ratio of the thickness dimension to the width dimension being, for example, significantly over 1 to 1 (e.g., 2 to 1, 5 to 1, 10 to 1, 100 to 1, etc.). That is, a nanosheet is relatively short and wide. A nanofin refers to a nanoshape having its width dimension constrained to tens of nanometers or less (i.e., constrained to 100 nm or less), having its thickness (or height) dimension being greater than 100 nm and having the ratio of the thickness dimension to the width dimension being, for example, significantly less than 1 to 1 (e.g., 1 to 2, 1 to 5, 1 to 10, 1 to 100, etc.). That is, a nanofin is relatively tall and thin. Next, a replacement metal gate can be formed in the gate opening so as to wrap around each of the nanoshapes (i.e., so as to cover the top, bottom and opposing side surfaces of each of the nanoshapes). The gate sidewall spacer and the inner spacers should electrically isolate the gate from the source/drain regions and minimize parasitic gate to source/drain capacitance.

With device size scaling, however, inner spacers that are formed as described above may be too small to sufficiently reduce parasitic gate to source/drain capacitance. Specifically, proper formation of the inner spacers can be problematic because the selective isotropic etch process must be tightly controlled to ensure that the ends of the silicon layers in the source/drain recesses are exposed without removing the spacer material from the divots. Furthermore, for the selective isotropic etch process to work and, particularly, to provide adequate exposure to the wet etchant, the open space between adjacent gates (given the gate sidewall spacer, etc. thereon) must be at least 3 nm. Achieving this space requirement can be difficult when the gate pitch is scaling while the gate length and/or the sidewall spacer are not scaling—or at least not as much.

In view of the foregoing, disclosed herein are semiconductor structures that include one or more gate-all-around field effect transistors (GAAFETs) with air-gap inner spacers that minimize parasitic gate to source/drain capacitance. Also disclosed herein are methods of forming the above-described semiconductor structures and these methods include a technique for forming the air-gap inner spacers that avoids violating any minimum gap requirements when etching spacer material and, thus, facilitates device size scaling.

More particularly, referring to FIGS. 1A-1E, disclosed herein are embodiments of a semiconductor structure 100. This semiconductor structure 100 can include a semiconductor substrate 101, an optional buried insulator 130 on the top surface of the semiconductor substrate 101 and, on the optional buried insulator 130, one or more gate-all-around field effect transistors (GAAFETs) 110a-110d with air-gap inner spacers 120.

FIG. 1A is a layout diagram showing an exemplary semiconductor structure 100 that includes four GAAFETs 110a-110d arranged columns and rows of two. Specifically, the GAAFETs 110a-110d include: a first row with GAAFETs 110a and 110b, which have a shared source/drain region 112 between them; a second row with GAAFETs 110c and 110d, which have a shared source/drain region 112 between them; a first column with GAAFETs 110a and 110c, which have a shared gate structure 115; and a second column of GAAFETs 110d and 110b, which have another shared gate structure 115. FIG. 1A is provided to show the relative positioning of the GAAFETs 110a-110d in the exemplary semiconductor structure 100 by identifying the gates 115 and source/drain regions 112; however, in order to avoid clutter and allow the reader to focus on the salient aspects of the disclosed embodiments, FIG. 1A does not show all of the other components that make up the GAAFETs or the semiconductor structure 100. FIGS. 1B, 1C, 1D and 1E are detailed cross-section diagrams XX, X'X', YY, and Y'Y' of the semiconductor structure 100 shown in the layout of FIG. 1A. It should be understood that these FIGS. 1A-1E are not intended to be limiting. For example, while the exemplary semiconductor structure 100 shown in FIGS. 1A-1E includes four GAAFETs with air-gap inner spacers 120, the semiconductor structure 100 could, alternatively, include any number one or more GAAFETs with air-gap inner spacers 120, as described below.

In any case, the semiconductor structure 100 can include a semiconductor substrate 101. The semiconductor substrate 101 can be made of a monocrystalline semiconductor material. For example, the semiconductor substrate 101 can be monocrystalline silicon or some other suitable monocrystalline semiconductor material.

The semiconductor structure 100 can further include trench isolation regions 105 in the semiconductor substrate 101 positioned laterally between the rows of GAAFETs (e.g., between the row including GAAFET 110a and the row including GAAFET 110c, as shown in FIGS. 1D and 1E). The trench isolation regions 105 can include trenches etched into the top surface of the semiconductor substrate 101 and filled with a first dielectric material. The first dielectric material can be, for example, silicon dioxide or any other suitable dielectric material. As illustrated in FIGS. 1D and 1E, the top surfaces of the trench isolation regions 105 can be above the level of the top surface of the semiconductor substrate.

The semiconductor structure 100 can, optionally, further include a buried insulator 130 on the top surface of the semiconductor substrate 101. The buried insulator 130 can be made, for example, of a second dielectric material that is different from the first dielectric material. The second dielectric material can be, for example, silicon oxynitride, a low-K dielectric material, or any other suitable dielectric material that is different from the first dielectric material. Those skilled in the art will recognize that a "low-K dielectric material" refers to a dielectric material with a dielectric constant that is less than that of silicon nitride (i.e., less than 7). Exemplary low-K dielectric materials include, but are not limited to, carbon-doped silicon oxynitride (SiONC), silicon carbon nitride (SiCN), silicon oxycarbide (SiCO), and hydrogenated silicon oxycarbide (SiCOH).

The semiconductor structure 100 can further include one or more gate-all-around field effect transistors (GAAFETs) 110 on the buried insulator 130.

The buried insulator 130 can be made, for example, of a second dielectric material that is different from the first dielectric material. The second dielectric material can be, for example, silicon oxynitride, a low-K dielectric material, or any other suitable dielectric material that is different from the first dielectric material. For purposes of this disclosure, a "low-K dielectric material" refers to a dielectric material with a dielectric constant that is less than that of silicon nitride (i.e., less than 7). Exemplary low-K dielectric materials include, but are not limited to, carbon-doped silicon oxynitride (SiONC), silicon carbon nitride (SiCN), silicon oxycarbide (SiCO), and hydrogenated silicon oxycarbide (SiCOH).

Each GAAFET 110a-110d can include source/drain regions 112 above and immediately adjacent to the buried insulator 130 and a stack 199 of elongated monocrystalline semiconductor nanoshapes 111 (e.g., nanowires or nanosheets), which extend laterally between the source/drain regions 112 and which function as channel regions.

The source/drain regions 112 can include source/drain recesses filled by epitaxial deposition of, for example, the same semiconductor material as the semiconductor substrate 101 (e.g., monocrystalline silicon) or some other suitable monocrystalline semiconductor material, which is preselected, for example, to improve channel mobility depending upon the GAAFET conductivity type. Additionally, those skilled in the art will recognize that the conductivity type of the source/drain regions 112 will vary depending upon whether the GAAFETs are P-type (i.e., PFETs) or N-type (i.e., NFETs). That is, for PFETs, the semiconductor material of the source/drain regions 112 can be doped so as to have P-type conductivity at a relatively high conductivity level (i.e., P+ conductivity); whereas, for NFETs, the semiconductor material of the source/drain regions 112 can be doped so as to have N-type conductivity at a relatively high conductivity level (i.e., N+ conductivity). As mentioned above, adjacent GAAFETs (e.g., 110a and 110b; 110c and 110d) can have a shared source/drain region between them.

The stack 199 of elongated monocrystalline semiconductor nanoshapes 111 can include, for example, one or more nanoshape(s) (e.g., nanowires or nanosheets) that are parallel, stacked one above the other, and physically separated. The nanoshapes 111 can be made, for example, of the same semiconductor material as the semiconductor substrate 101 or some other suitable monocrystalline semiconductor material, which is preselected, for example, to improve channel mobility depending upon the GAAFET conductivity type. In any case, the nanoshapes 111, which as mentioned above function as channel regions in the GAAFETs 110a-110d, can be either intrinsic (i.e., undoped) or doped so as to have a desired conductivity type and level. Those skilled in the art will recognize that the conductivity type of the nanoshapes 111 will vary depending upon whether the GAAFETs are P-type (i.e., PFETs) or N-type (i.e., NFETs). That is, for PFETs, the semiconductor material of the nanoshapes 111 can be either undoped or doped so as to have N-type conductivity at a relatively low conductivity level (i.e., N-conductivity); whereas, for NFETs, the semiconductor material of the nanoshapes 111 can be either undoped or doped so as to have P-type conductivity at a relatively low conductivity level (i.e., P-conductivity).

Each GAAFET 110a-110d can further include a gate structure 115 (e.g., a replacement metal gate (RMG) structure) with a gate cap 116. The gate structure 115 can have a bottom surface above and immediately adjacent to the buried insulator 130. The gate structure 115 can further wrap around (i.e., cover the top, bottom and opposing side surfaces) of a center portion of each nanoshape 111 in the stack 199. It should be understood that, in a GAAFET, the gate structure (e.g., a RMG structure) will typically include: one or more conformal gate dielectric layers (e.g., a thin oxide layer and/or a high-K dielectric layer) immediately adjacent to the nanoshapes 111 and one or more gate conductor layers (e.g., a conformal metal layer, a fill metal layer, etc.) on the gate dielectric layer. However, to avoid clutter in the drawings and to allow the reader to focus on the salient aspects of the disclosed structures, the specific gate dielectric layer(s) and gate conductor layer(s) within the gate structures 115 are not illustrated. In any case, the gate structure 115 can have a lower portion below and between each of the nanoshapes 111 in the stack 199 and an upper portion above the lower portion. The gate structure 115 can have external sidewalls 141 (i.e., perimeter sidewalls). Additionally, the lower portion of the gate structure 115 can have opposing internal sidewalls 142 adjacent to the source/drain regions 112, respectively (as illustrated in FIG. 1B).

Each gate structure 115 can be capped by a gate cap 116. The gate cap 116 can be made of a third dielectric material that is different from the first dielectric material of the trench isolation region 105 and the second dielectric material of the buried insulator 130. The third dielectric material can be, for example, silicon nitride or any other suitable dielectric material.

To provide electrical isolation between the gate structure 115 and the adjacent source/drain regions 112 and to further minimize parasitic gate to source/drain capacitance, each GAAFET 110a-110d can further include a gate sidewall spacer 117 and air-gap inner spacers 120 within the gate sidewall spacer 117 and adjacent to the source/drain regions 112, respectively.

Specifically, a gate sidewall spacer 117 can be positioned laterally adjacent to the external sidewalls 141 of the gate structure 115 and the gate cap 116 thereon. The gate sidewall spacer 117 can be made, for example, of the same second dielectric material used for the buried insulator 130. Thus, the gate sidewall spacer 117 can be made of silicon nitride, silicon oxynitride, a low-K dielectric material, or any other suitable dielectric material that is different from the first dielectric. As discussed in greater detail below with regard to the methods, the gate sidewall spacer 117 and buried insulator 130 can be formed currently such that they are formed as one contiguous layer of the same dielectric material.

Air-gap inner spacers 120 can be within the gate sidewall spacer 117 positioned laterally between and immediately adjacent to the source/drain regions 112 and the opposing internal sidewalls 142 of the gate 115, respectively, and, thus, also adjacent to the end portions of the nanoshapes 111. Specifically, each GAAFET can include a a first air-gap inner spacer between a first internal sidewall of the lower portion of the gate and a first source/drain region and a second air-gap inner spacer between a second internal sidewall of the lower portion of the gate and a second source/drain region. As illustrated in FIG. 1D, each air-gap inner spacer 120 can include an inner spacer cavity 119 between the corresponding source/drain region 112 and the gate 115. The inner spacer cavity 119 can be essentially ladder-shaped with a pair of vertical air-gap sections "A" within the gate sidewall spacer 117, above the buried insulator 130 and on opposing sides of the stack 199 of nanoshapes 111 at one end adjacent to the corresponding source/drain region and with multiple stacked horizontal air-gap sections "B" that are below each nanoshape 111 and that extend laterally between the pair of vertical air-gap sections "A". Within the inner spacer cavity 119, the lowermost horizontal air-gap section is between the buried insulator 130 and an end portion of the lowermost nanoshape in the stack 199 and the uppermost horizontal air-gap section is below an end portion of the uppermost nanoshape in the stack 199. Furthermore, as illustrated and discussed in greater detail below with regard to the methods, a proximal side of the corresponding source/drain region 112, which abuts the nanoshapes 111 and the air-gap inner spacer 120, is essentially planar and, particularly, essentially perpendicular to the top surface of the buried insulator 130. Additionally, as illustrated specifically in FIG. 1D and discussed in greater detail below with regard to the methods, the tops of the vertical air-gap sections "A" of each inner spacer cavity 119 can be above the level of the top surface of the uppermost nanoshape in the stack of nanoshapes and can further be above the level of the top surfaces of the source/drain regions 112.

Each inner spacer cavity 119 can be lined with a dielectric liner 118 (e.g., a thin conformal silicon nitride liner). That is, surfaces of the gate sidewall spacer 117, buried insulator 130, the internal sidewall 142 of the gate 115, and the end portions of the nanoshapes 111 within each inner spacer cavity 119 can be conformally covered by the dielectric liner 118. The remaining space within each inner spacer cavity 119 can be essentially empty or air-filled (i.e., devoid of any material not in a gaseous state).

A blanket interlayer dielectric (ILD) material layer 150 can cover each GAAFET 110a-110d. Specifically, the blanket ILD material layer 150 can be on the top surfaces of the source/drain regions 112 and positioned laterally adjacent to the gate sidewall spacer 117 such that, in each GAAFET, the top surfaces of the ILD material layer 150, the gate sidewall spacer 117 and the gate cap 116 are essentially coplanar. The ILD material layer 150 can further seal off the openings to each inner spacer cavity 119. As discussed in greater detail below with regard to the methods, these openings 145 can be near the tops of the vertical air-gap sections "A" of each cavity and, particularly, between the top of the adjacent source/drain region 112 and the tops of the vertical air-gap sections (see FIG. 1C). It should be noted that, during processing, the ILD material layer 150 could be directionally deposited so that it only builds up on horizontal surfaces and so that it does not enter the inner spacer cavities 119 at the openings 145. Alternatively, the ILD material layer 150 can be deposited isotropically so that some of the material enters the inner spacer cavities at the openings 145; however, as illustrated in the alternative cross-section XX shown in FIG. 2, given the size of the opening and the aspect ratio of the vertical air-gap sections, the material will pinch off at the top of the vertical air-gap sections such that the resulting inner spacer is still an air-gap inner spacer. In any case, the ILD material 150 can be the same first dielectric material (e.g., silicon dioxide) that is used for the trench isolation regions 105.

Also disclosed herein are methods of forming the above-described semiconductor structures.

Figure 3:
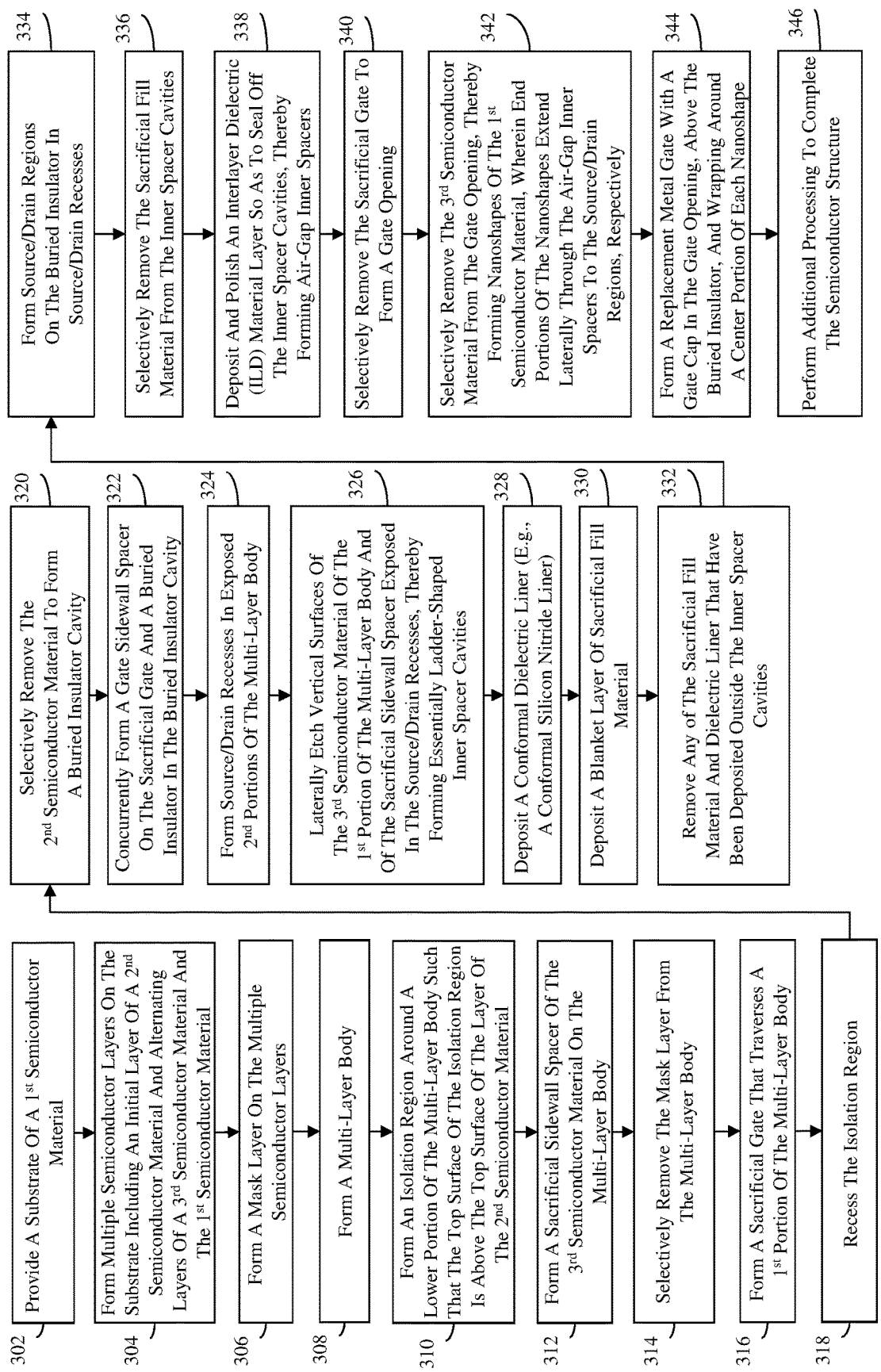
FIG. 3 is a flow diagram illustrating a method of forming the semiconductor structure shown in FIGS. 1A-1E.
Figure 4:
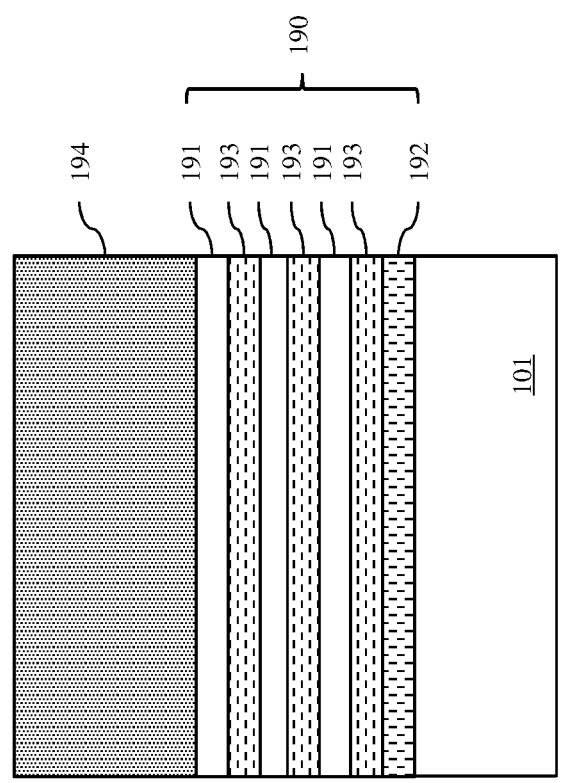
FIG. 4 is a cross-section diagram of a partially completed semiconductor structure formed according to the method of FIG. 3.
Figure 7C:
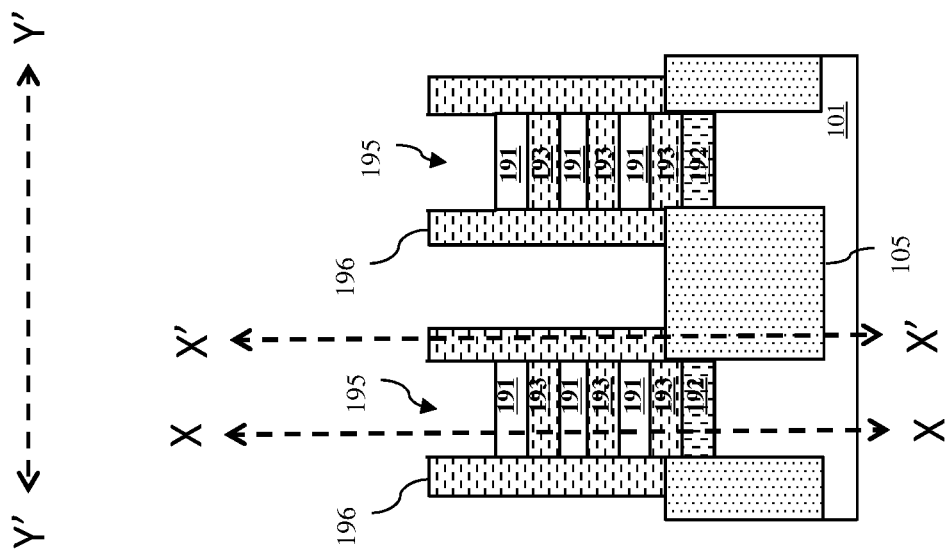
Figure 7D:
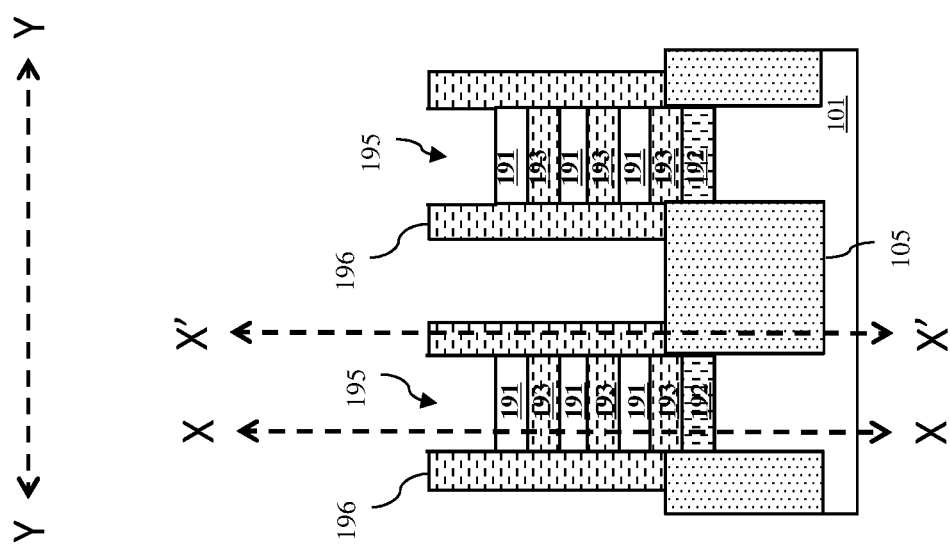
Figure 8C:
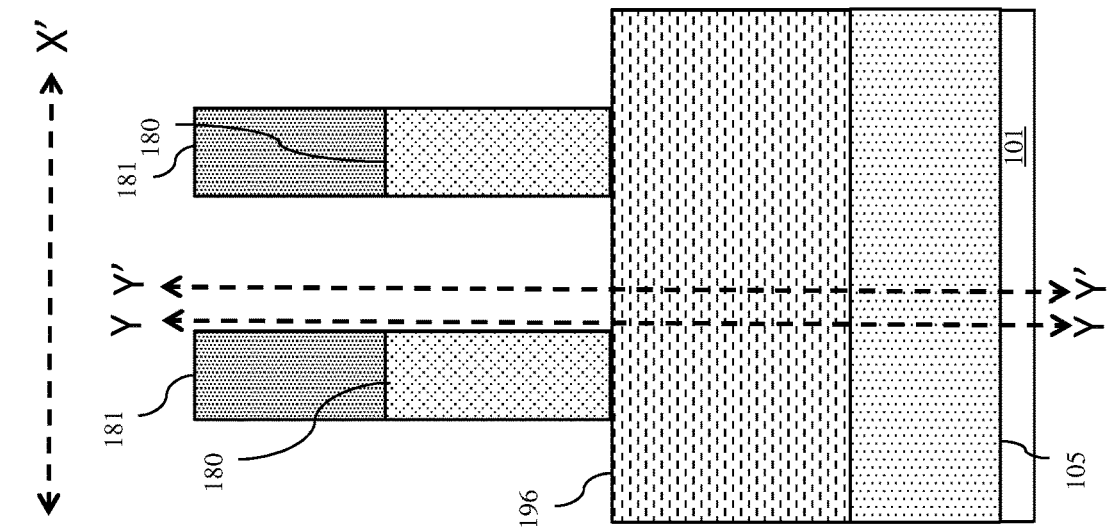
FIG. 8A is a top view and FIGS. 8B-8E are different cross-section diagrams of a partially completed structure formed according to the method of FIG. 3.
Figure 8B:
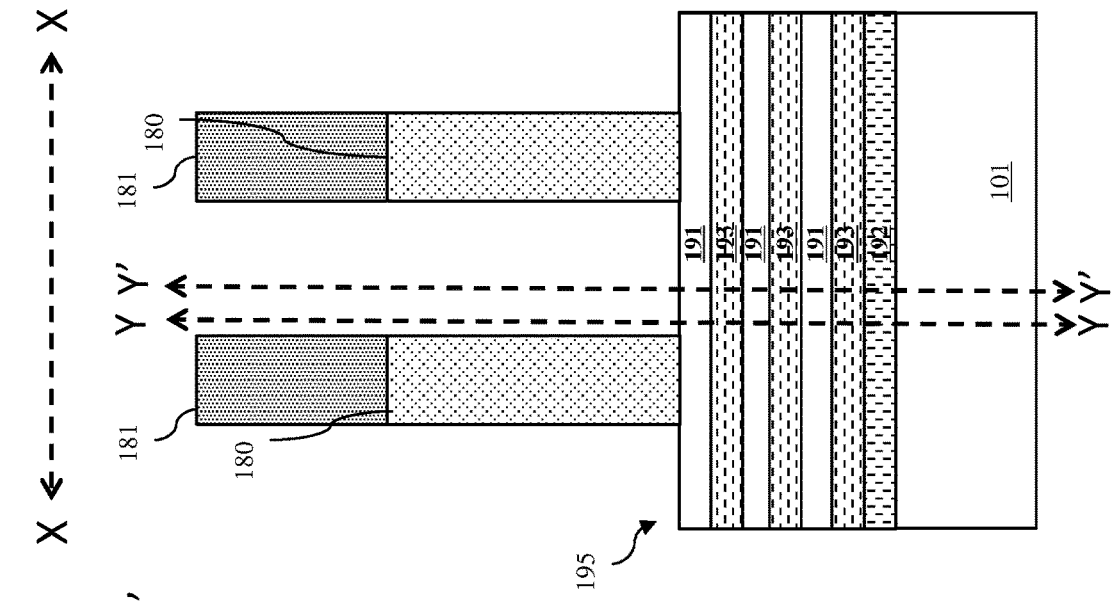
Figure 8A:
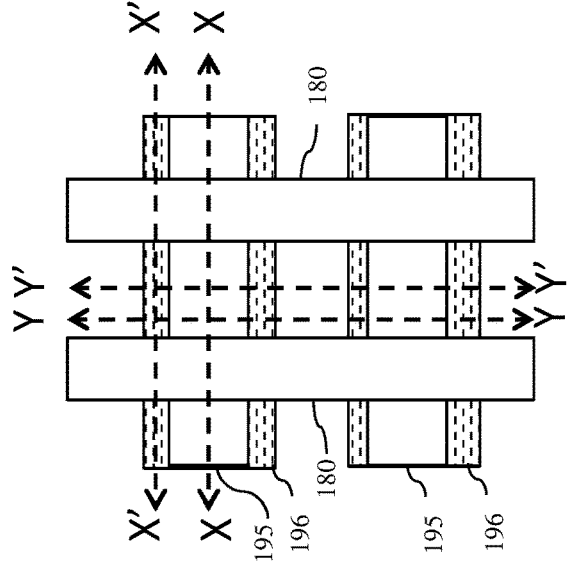
Figure 8E:
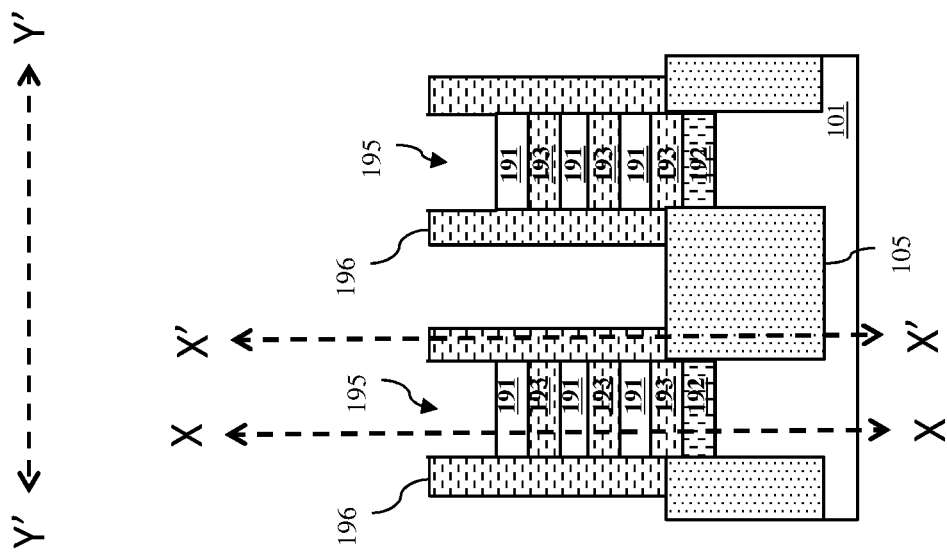
Figure 8D:
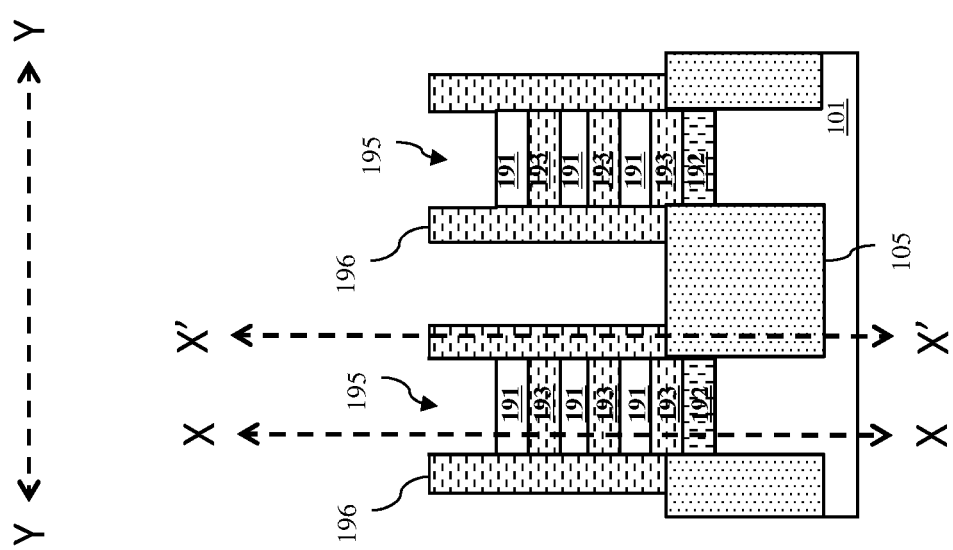
Figures 9A, 9B:
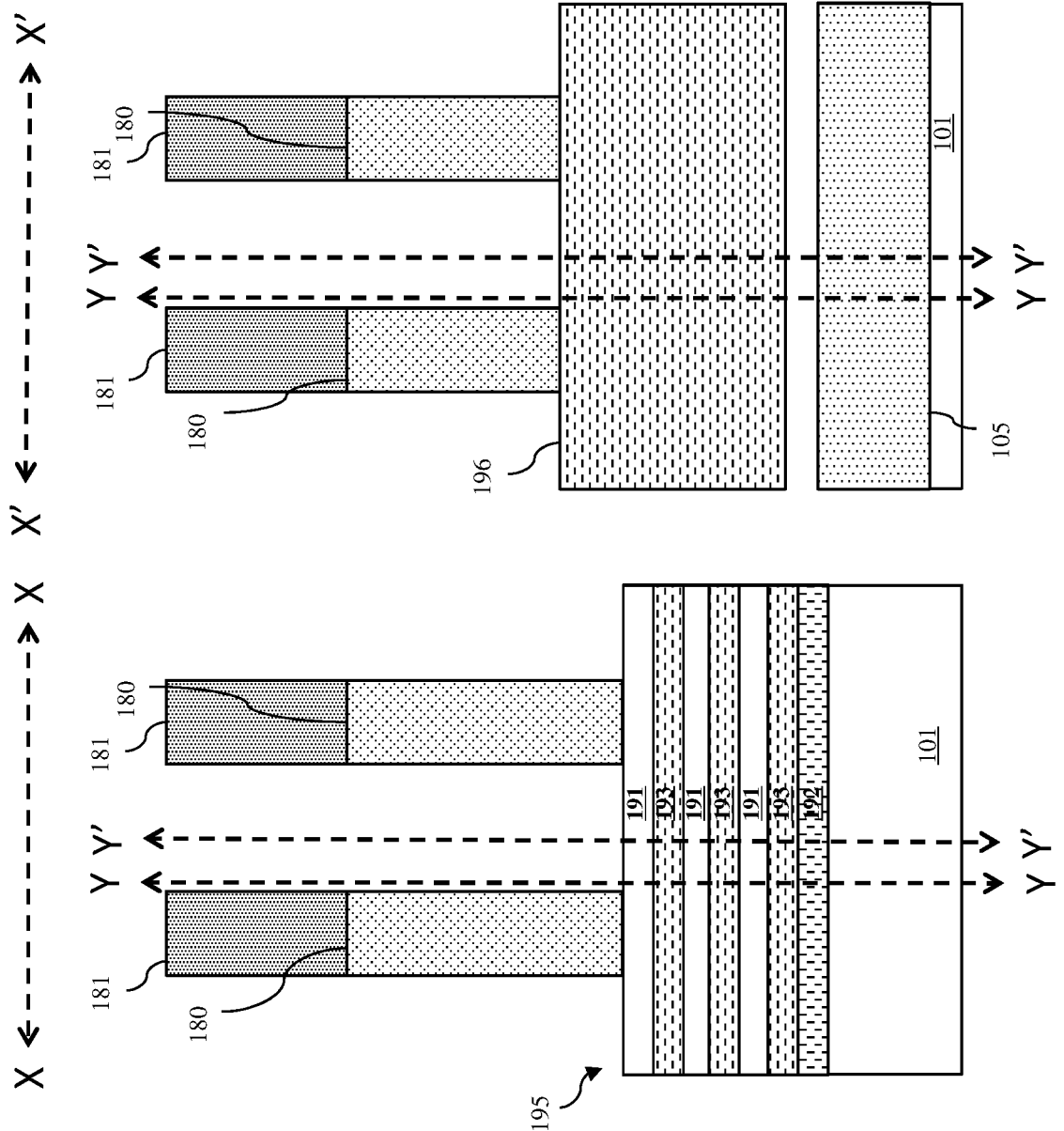
FIGS. 9A-9D are different cross-section diagrams of a partially completed structure formed according to the method of FIG. 3.
Figure 9D:
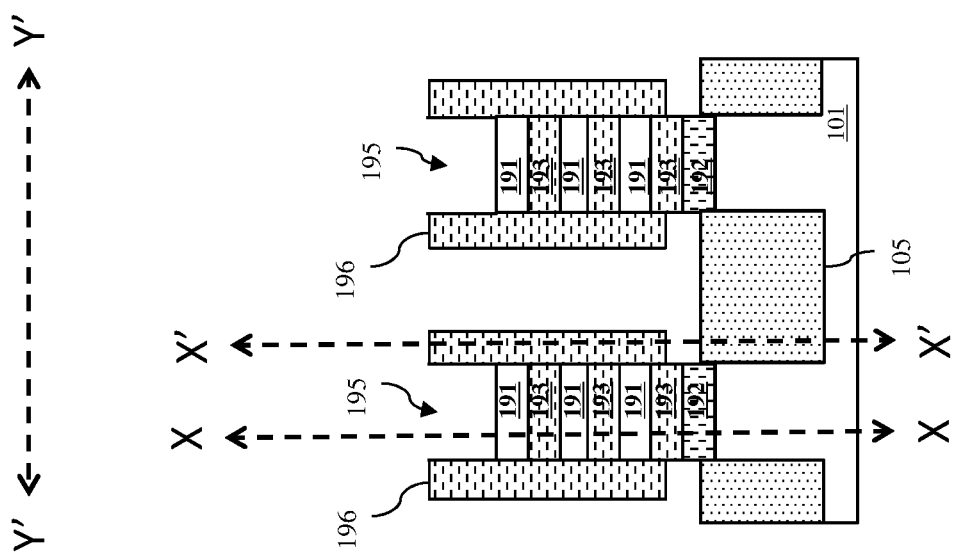
Figure 9C:
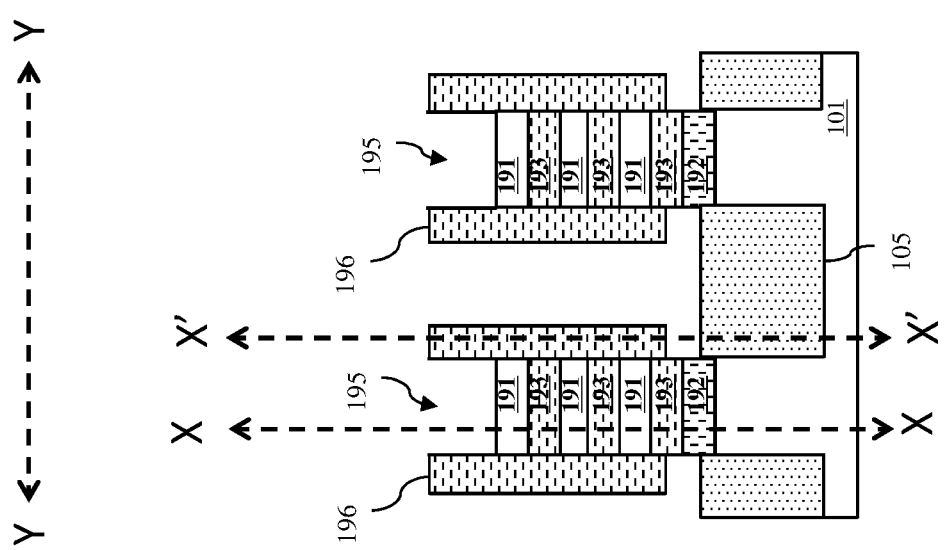
Figure 10B:
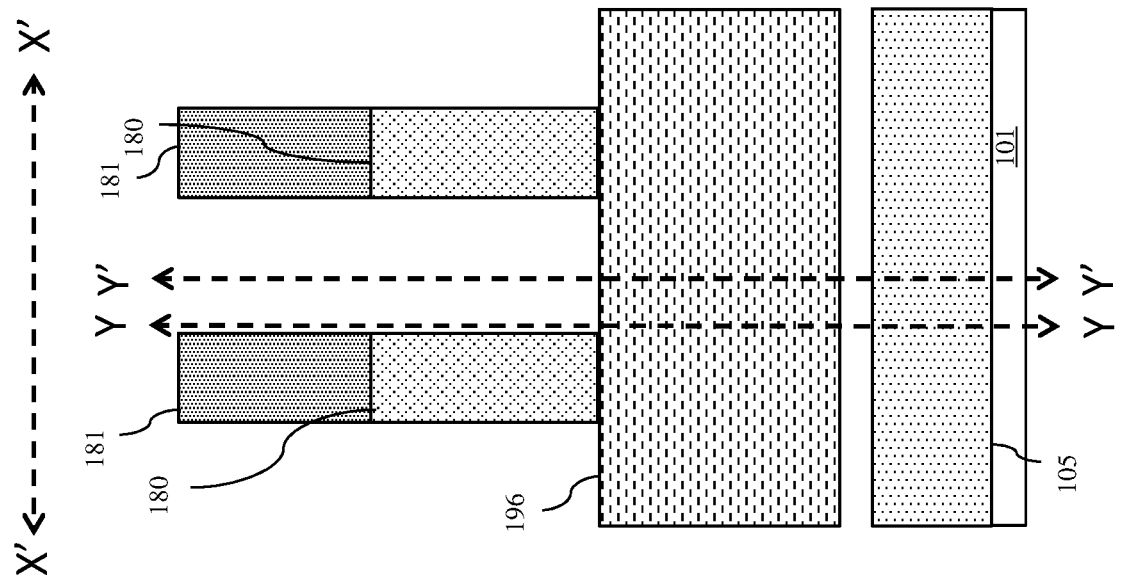
FIGS. 10A-10D are different cross-section diagrams of a partially completed structure formed according to the method of FIG. 3.
Figure 10A:
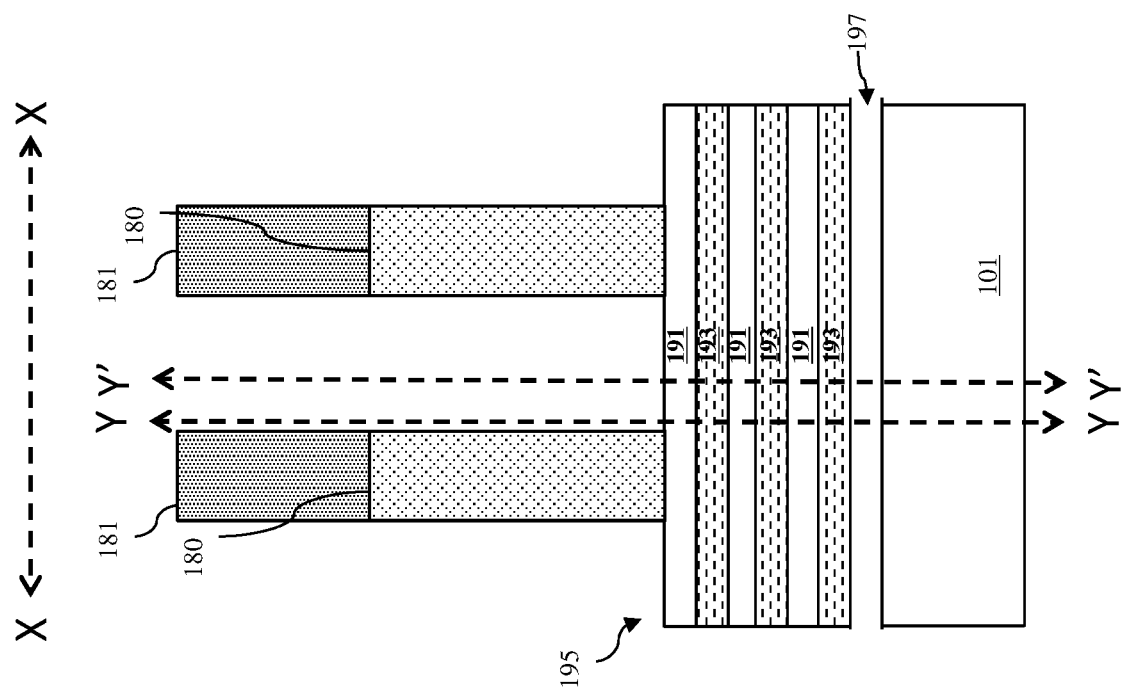
Figure 10C:
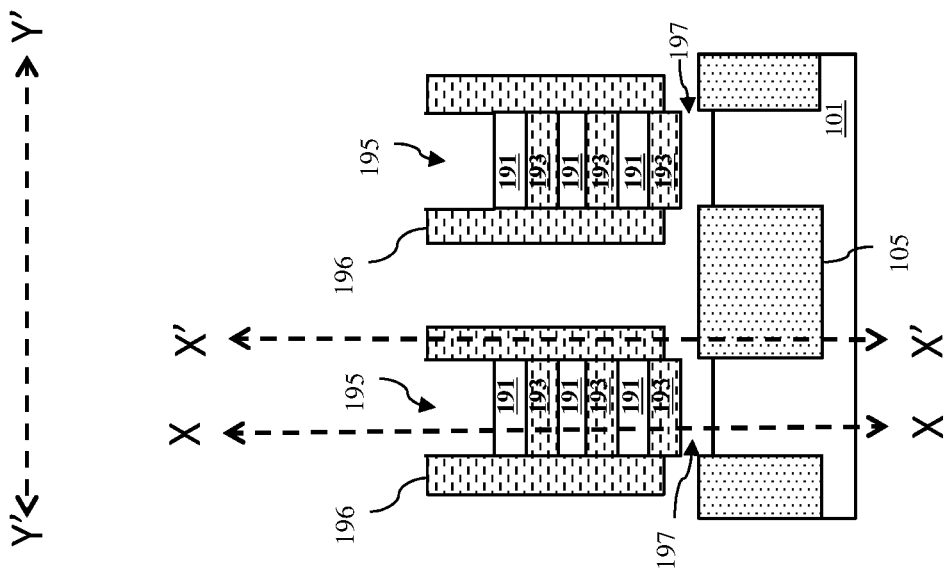
Figure 10D:
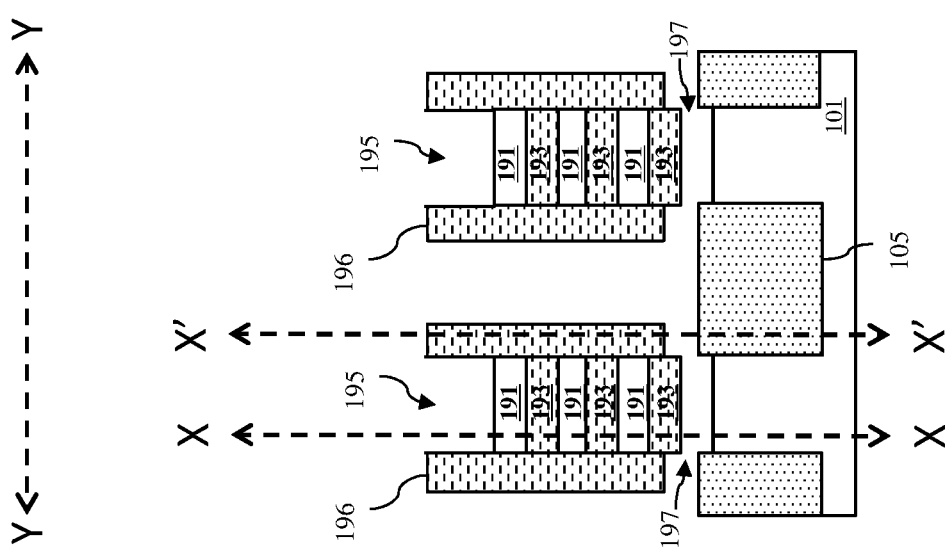

An exemplary method, as illustrated in the flow diagram of FIG. 3, can begin with a semiconductor substrate 101 (see process step 302 and FIG. 4). The semiconductor substrate 101 can be a bulk semiconductor wafer made of a first semiconductor material (e.g., monocrystalline silicon).

The method can further include forming, on the semiconductor substrate 101, at least one gate-all-around field effect transistor (GAAFET) 110a-110d with air-gap inner spacers 120, as described in detail above and illustrated in FIG. 1A, 1B, 1C or 2, 1D and 1E. For purposes of illustration, the methods are described below and illustrated in the figures with respect to the formation of four GAAFETs 110a-110d. However, it should be understood that the figures and description are not intended to be limiting and that, alternatively, the method steps described could be used to form any number of one or more GAAFETs. In any case, the air-gap inner spacers 120 can be formed, for example, by creating inner spacer cavities and by forming preliminary inner spacers in the inner spacer cavities, before the source/drain regions are formed. These preliminary inner spacers can include a dielectric liner and a sacrificial fill material on the dielectric liner. Subsequently and, particularly, after the source/drain regions are formed, the sacrificial fill material can be selectively removed from the inner spacer cavities and interlayer dielectric material can be deposited so as to seal off the inner spacer cavities such that the air-gap inner spacers are formed.

To form such GAAFET(s), the methods can include forming multiple monocrystalline semiconductor layers 190 on the top surface of the semiconductor substrate 101 (see process step 304 and FIG. 4). These semiconductor layers 190 can be formed, for example, by epitaxial deposition and can include an initial layer 192 of a second semiconductor material that is different from the first semiconductor material and alternating layers 193 and 191 of a third semiconductor material, which is different from both the first and second semiconductor materials, and the first semiconductor material, respectively. For example, in one exemplary embodiment, the first semiconductor material can be monocrystalline silicon, the second semiconductor material can be either monocrystalline germanium or monocrystalline silicon germanium with a relatively high percentage of germanium (i.e., a first germanium percentage), and the third semiconductor material can be monocrystalline silicon germanium with a relatively low percentage of germanium and, particularly, a lower percentage of germanium than in the second semiconductor material (i.e., a second germanium percentage that is different and, particularly, lower than the first germanium percentage). In any case, the second semiconductor material of the initial layer 192 can be preselected so that it can be selectively etched over the first semiconductor material and the third semiconductor material (i.e., so that it can be selectively removed during subsequent processing). Similarly, the third semiconductor material of the alternating layers can be preselected so that it can be selectively etched over the first semiconductor material (i.e., so that it can be selectively removed during subsequent process).

It should be noted that layers 191 of the first semiconductor material will be used during subsequent processing to form the nanoshapes that will function as the channel regions of the GAAFETs being formed. Thus, these layers 191 can be either intrinsic (i.e., undoped) or in situ doped during epitaxial deposition so as to have a desired conductivity type and level. Those skilled in the art will recognize that the conductivity type will vary depending upon whether the GAAFETs are P-type (i.e., PFETs) or N-type (i.e., NFETs). That is, for PFETs, layers 191 can be either undoped or doped so as to have N-type conductivity at a relatively low conductivity level (i.e., N-conductivity); whereas, for NFETs, the layers 191 can be either undoped or doped so as to have P-type conductivity at a relatively low conductivity level (i.e., P-conductivity).

A mask layer 194 (e.g., a silicon nitride mask layer) can be formed above the multiple semiconductor layers 190 (see process step 306 and FIG. 4). Then, one or more multi-layer, essentially rectangular-shaped, bodies 195 (e.g., fin-shaped body(ies)) can be formed using this partially completed structure (see process step 308 and FIGS. 5A-5C). As mentioned above, for purposes of illustration, the methods are described herein and illustrated in the figures with respect to the formation of four GAAFETs 110a-110d. In this case, two essentially parallel multi-layer bodies can be formed at process step 308. The multi-layer bodies 195 can be formed, for example, using conventional lithographic patterning and etch processes, sidewall image transfer processes, etc. It should be noted that the multi-layer bodies 195 should be etched at process step 308 through the mask layer 194, each of the multiple semiconductor layer 190 and into the semiconductor substrate 101 such that trenches are formed in the top surface of the semiconductor substrate 101. As a result, following process step 308, each multi-layer body 195 will include the first semiconductor material (and, particularly, an etched portion of the semiconductor substrate 101), a layer 192 of the second semiconductor material above the first semiconductor material, alternating layers 193 and 191 of the third semiconductor material and the first semiconductor material above layer of the layer 192, and a mask layer 194 above an uppermost layer of the first semiconductor material.

Next, an isolation region 105 (e.g., a shallow trench isolation (STI) region) can be formed with the trenches around and between the lower portions of the multi-layer bodies 195 (see process step 310 and FIG. 5C). Specifically, a first dielectric material can be deposited and etched back such that the top surface of the isolation region 105 is above the level of the top surface of the layer 192 of the second semiconductor material within each multi-layer body 195 such that the second semiconductor material is protected during subsequent processing. The first dielectric material can be, for example, silicon dioxide.

A sacrificial sidewall spacer 196 can then be formed on the sidewalls of each multi-layer body 195 (see process step 312 and FIGS. 6A-6E). This sacrificial sidewall spacer 196 can be made, for example, of the same third semiconductor material used when forming the multiple semiconductor layers 190 on the semiconductor substrate 101 at process step 304. Thus, for example, the sacrificial sidewall can be made of silicon germanium with a relatively low percentage of germanium. Such a sacrificial sidewall spacer 196 can be formed using conventional sidewall spacer formation techniques. That is, the third semiconductor material can be conformally deposited (e.g., using a chemical vapor deposition (CVD) process) over the partially completed structure and an anisotropic etch process can be performed. Alternatively, the sacrificial sidewall spacer 196 can be formed by epitaxially growing the third semiconductor material on the exposed semiconductor material of each multi-layer body. In this case, the third semiconductor material is overgrown so that it further extends upward onto vertical surfaces of the mask layer 194. In either case, the bottom surface of the sacrificial sidewall spacer 196 on each multi-layer body 195 will be immediately adjacent to the top surface of the adjacent isolation region 105 (and thereby above the level of the top surface of the layer 192 of the second semiconductor material within the multi-layer body 195). The top surface of the sacrificial sidewall spacer 196 on each multi-layer body should be above the level of the top surface of the uppermost layer 191 of the first semiconductor material within the multi-layer body 195. Additionally, when using the above-mentioned sidewall spacer techniques at process step 312, the sacrificial sidewall spacer 196 would be formed on the sidewalls of each multi-layer body 195 at both the opposing sides and the opposing ends (i.e., the sacrificial sidewall spacer 196 would laterally surround each multi-layer body 195). Thus, it should be understood that FIG. 6A shows only portion of the full length of the multi-layer bodies 195 in the XX, X'X' directions and, thus, only shows the sacrificial sidewall spacer 196 on the sidewalls of each multi-layer body 195 at the opposing sides and not at the opposing ends.

After the sacrificial sidewall spacer 196 is formed, the mask layer 194 can be selectively removed from each multi-layer body 195 (see process step 314 and FIGS. 7A-7D). As a result of process step 314, the top surface of the remaining portion of the multi-layer body 195 will now be below the level of the top surface of the sacrificial sidewall spacer 196.

Next, at least one sacrificial gate 180 with a sacrificial gate cap 181 can be formed (see process step 316 and FIGS. 8A-8E). As mentioned above, for purposes of illustration, the methods are described herein and illustrated in the figures with respect to the formation of four GAAFETs 110a-110d. In this case, two essentially parallel sacrificial gates 180, each having a sacrificial gate cap 181 and traversing a pair of parallel multi-layer bodies 195, can be formed at process step 308. For example, a thin conformal dielectric layer (e.g., a thin silicon dioxide layer (not shown)) can be deposited over the partially completed structure. Then, a blanket sacrificial gate layer can be deposited onto the conformal dielectric layer. This blanket sacrificial gate layer can be, for example, a polysilicon layer, an amorphous silicon layer or any other suitable sacrificial gate material that is different from the materials of the multi-layer bodies 195 (e.g., different from the first semiconductor material, the second semiconductor material, and the third semiconductor material) and that can be selectively and isotropically etched away from these materials during subsequent processing. The sacrificial gate layer can then be polished (e.g., using a CMP process) and a sacrificial dielectric cap layer (e.g., a silicon nitride cap layer) can be deposited onto the sacrificial gate layer. The resulting sacrificial gate stack can then be lithographically patterned and etched to form the sacrificial gates 180, each having a sacrificial gate cap 181.

It should be noted that the patterning and etch processes can be performed at process step 316 such that each sacrificial gate is on a first portion and, particularly, a designated channel region of at least one multi-layer body 195 and such that second portions and, particularly, designated source/drain regions of the multi-layer body 195 extend laterally beyond the sacrificial gate 180.

Additionally, it should be noted that, given the presence of the sacrificial sidewall spacer 196 on the sidewalls of each multi-layer body 195, the sacrificial gate 180 will be above and immediately adjacent to the top surface of the first portion of the multi-layer body 195 and will further extend over the adjacent sacrificial sidewall spacer 196 and down to the isolation region 105. Thus, the opposing sidewalls of the multi-layer body 195 will be physically separated from the sacrificial gate 180 by the sacrificial sidewall spacer 196.

Next, the isolation region 105 can be etched back (i.e., recessed) to expose at least an upper portion of the layer 192 of second semiconductor material of each multi-layer body 195 (see process step 318 and FIGS. 9A-9D). For example, since the isolation region 105 is made of a first dielectric material (e.g., silicon dioxide), the isolation region 105 can be recessed using an etch process that is selective for this first dielectric material over the exposed semiconductor materials. Techniques for selectively etching silicon dioxide over semiconductor materials are well known in the art and, thus, the details of these techniques have been omitted form the specification in order to allow the reader to focus on the salient aspects of the disclosed methods.

Next, the layer 192 of the second semiconductor material can be selectively removed from each multi-layer body 195, including from the first portion of each multi-layer body 195 under each sacrificial gate 180, to form a buried insulator cavity 197 within each multi-layer body 195 between the semiconductor substrate 101 and the stack of alternating layers 193 and 191 of the third semiconductor material and the first semiconductor material above (see process step 320 and FIGS. 10A-10D). Specifically, an isotropic etch process that is selective for the second semiconductor material over the first semiconductor material of the semiconductor substrate 101 and the multi-layer body 195, over the third semiconductor material of the sacrificial sidewall spacer 196 and the multi-layer body 195, over the sacrificial materials of the sacrificial gate 180 and the sacrificial gate cap 181 thereon, and over the first dielectric material of the isolation region 105 can be performed in order to completely remove the second semiconductor material, leaving the other above-mentioned materials essentially in tact. For example, as mentioned above in an embodiment disclosed herein, the first semiconductor material can be silicon, the second semiconductor material can be SiGe60, the third semiconductor material can be SiGe35, the sacrificial gate can be polysilicon or amorphous silicon, the sacrificial gate cap can be silicon nitride, and the first dielectric material can be silicon dioxide. In this case, the SiGe60 can be selectively removed, for example, using a hydrogen chloride (HCl) plasma etch process.

Figure 11B:
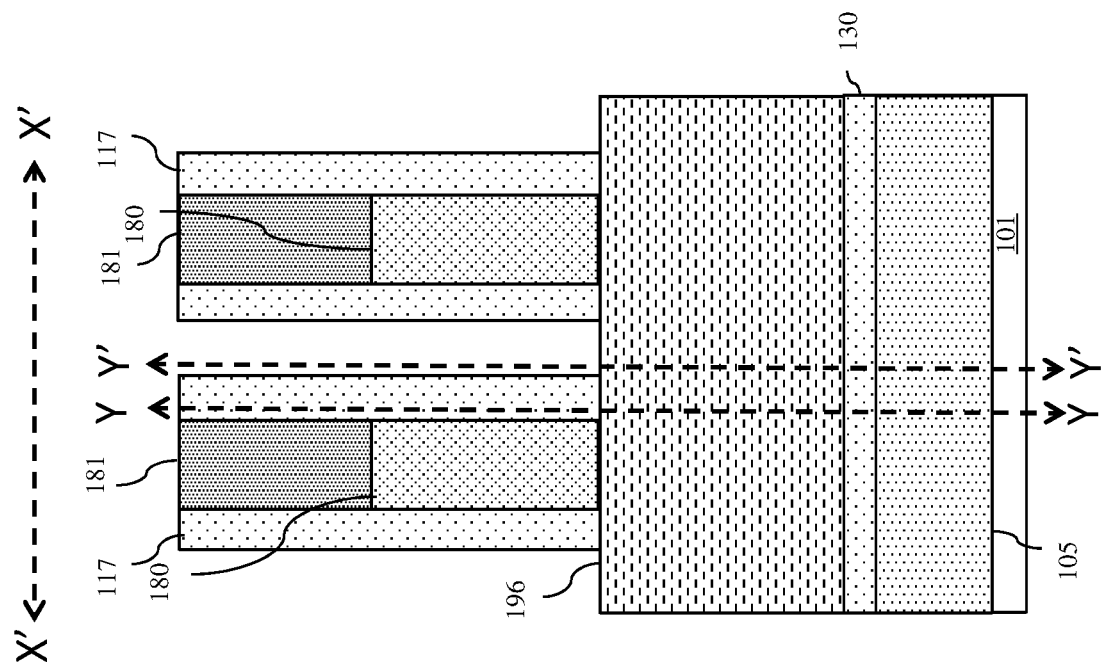
FIGS. 11A-11D are different cross-section diagrams of a partially completed structure formed according to the method of FIG. 3.
Figure 11A:
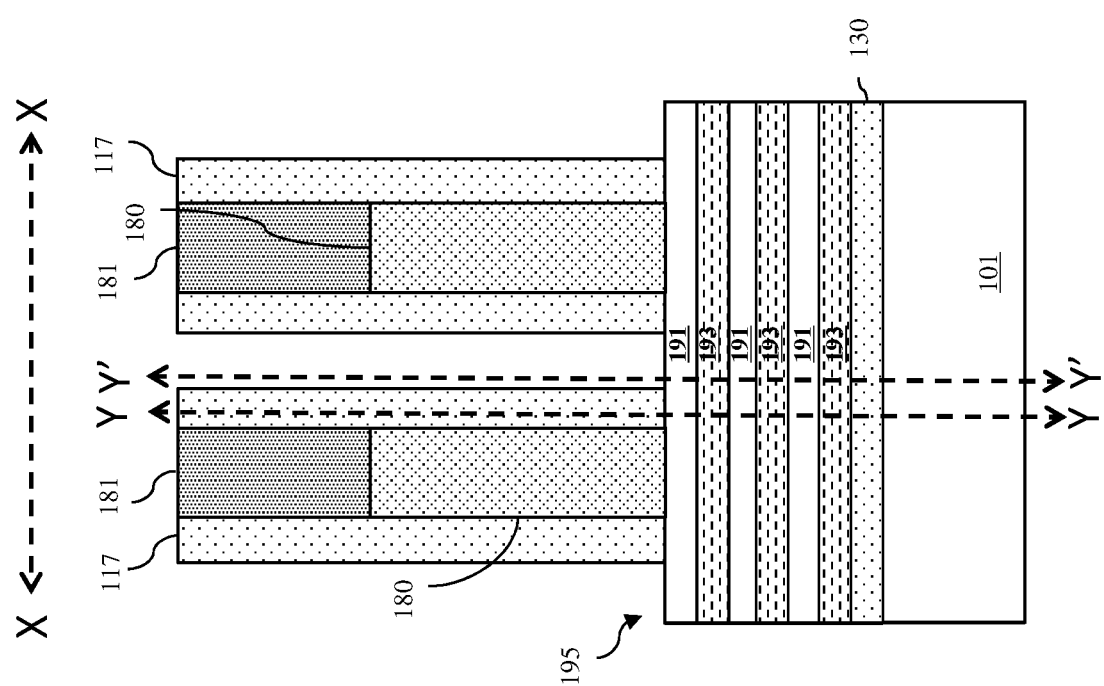
Figure 11C:
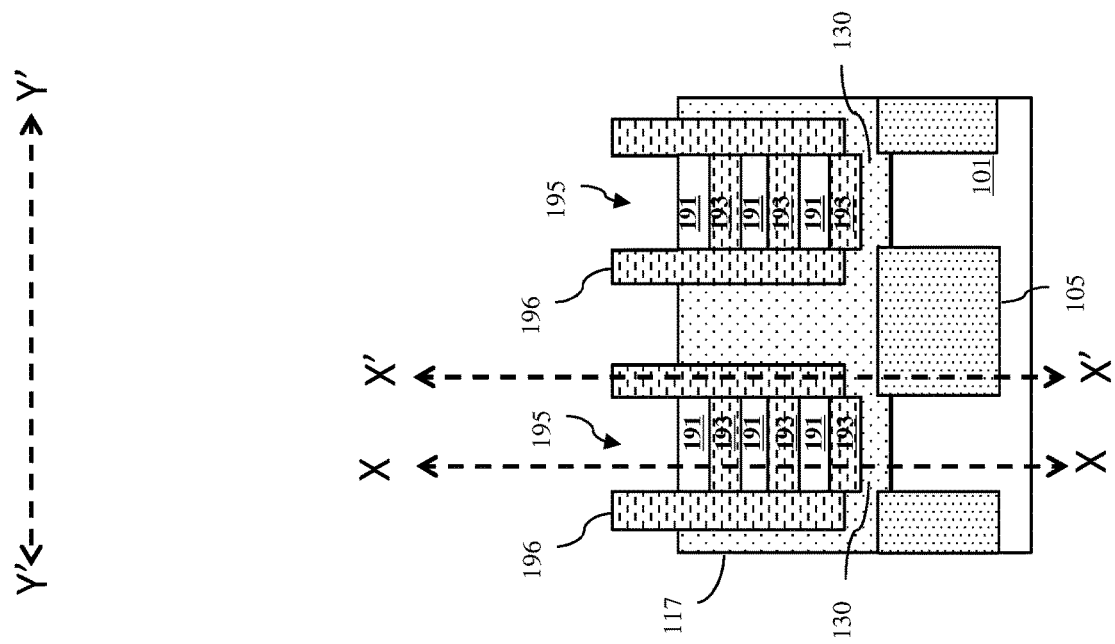
Figure 11D:
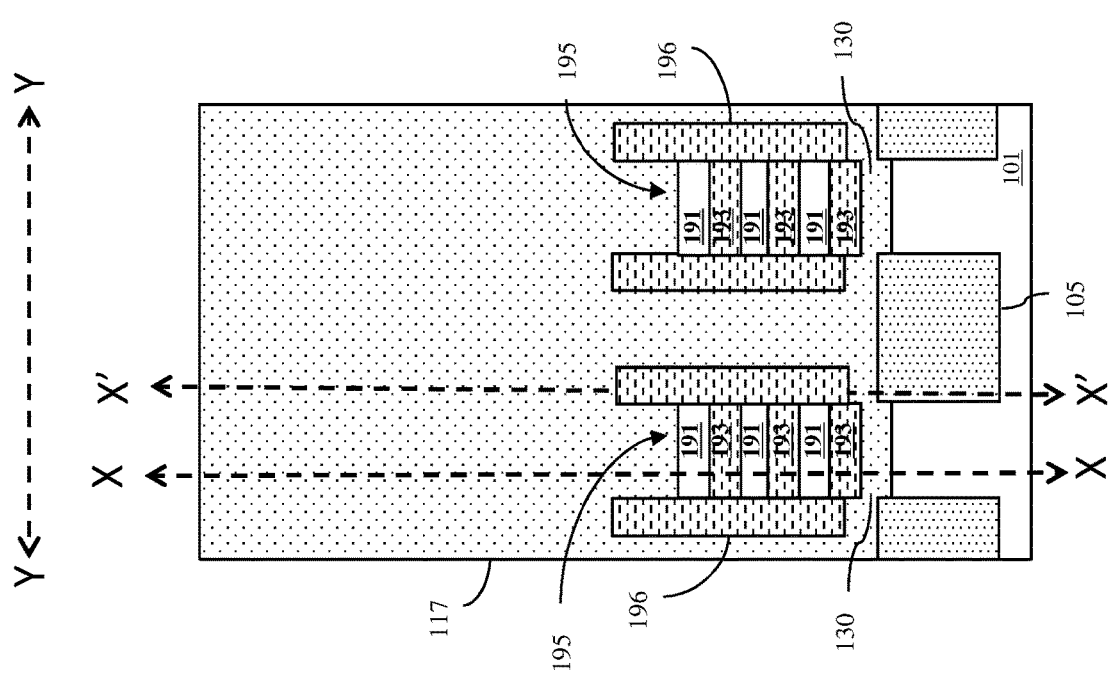
Figure 12:
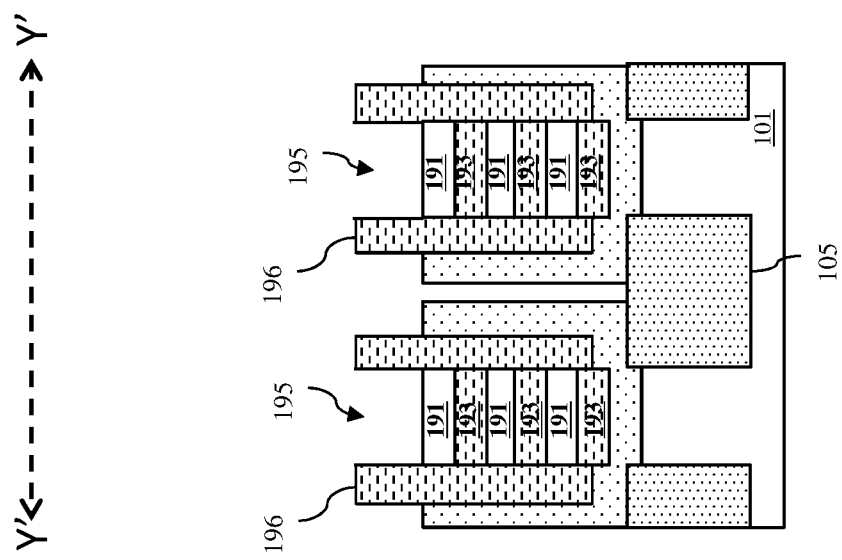
FIG. 12 is a cross-section diagram of a partially completed structure formed according to the method of FIG. 3.
Figure 13B:
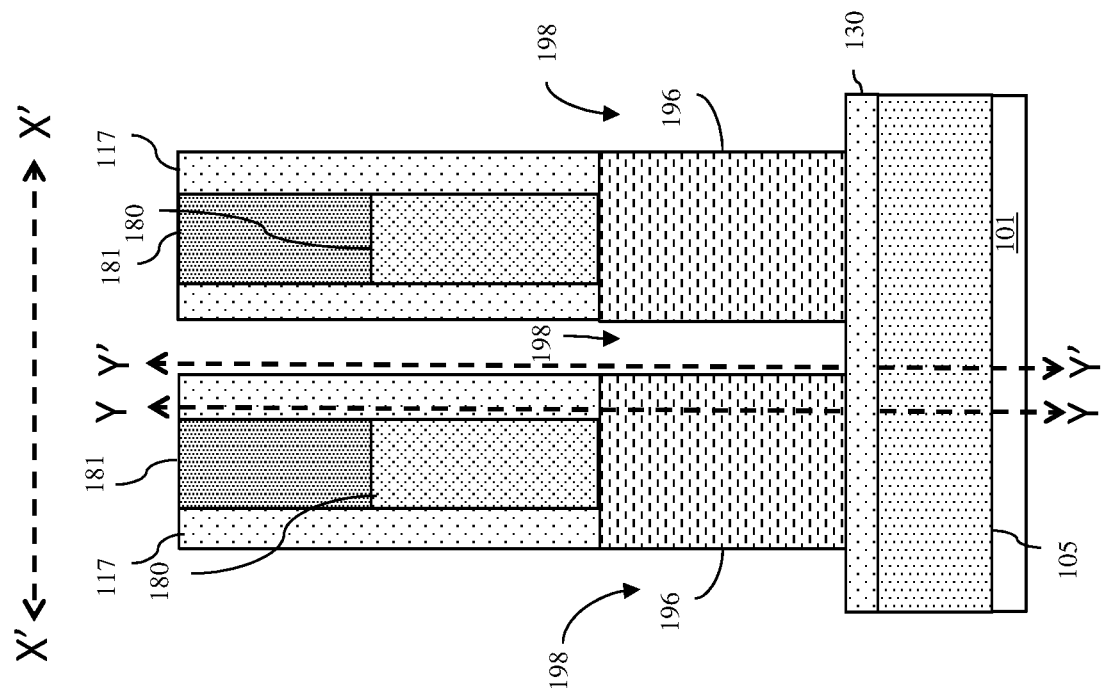
FIGS. 13A-13D are different cross-section diagrams of a partially completed structure formed according to the method of FIG. 3.
Figure 13A:
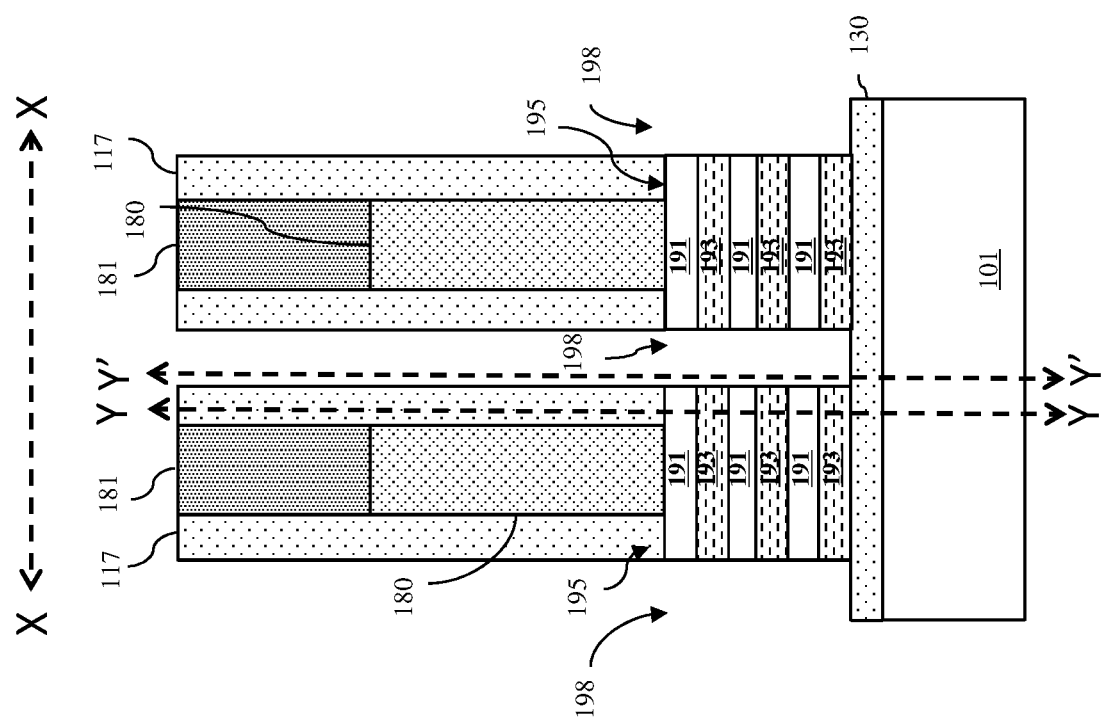
Figure 13C:
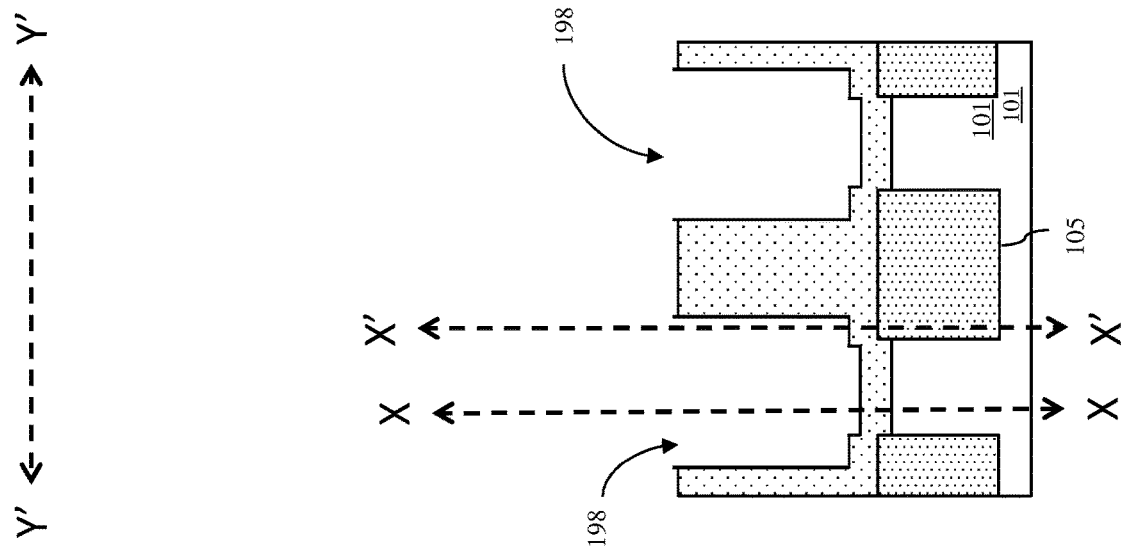
Figure 13D:
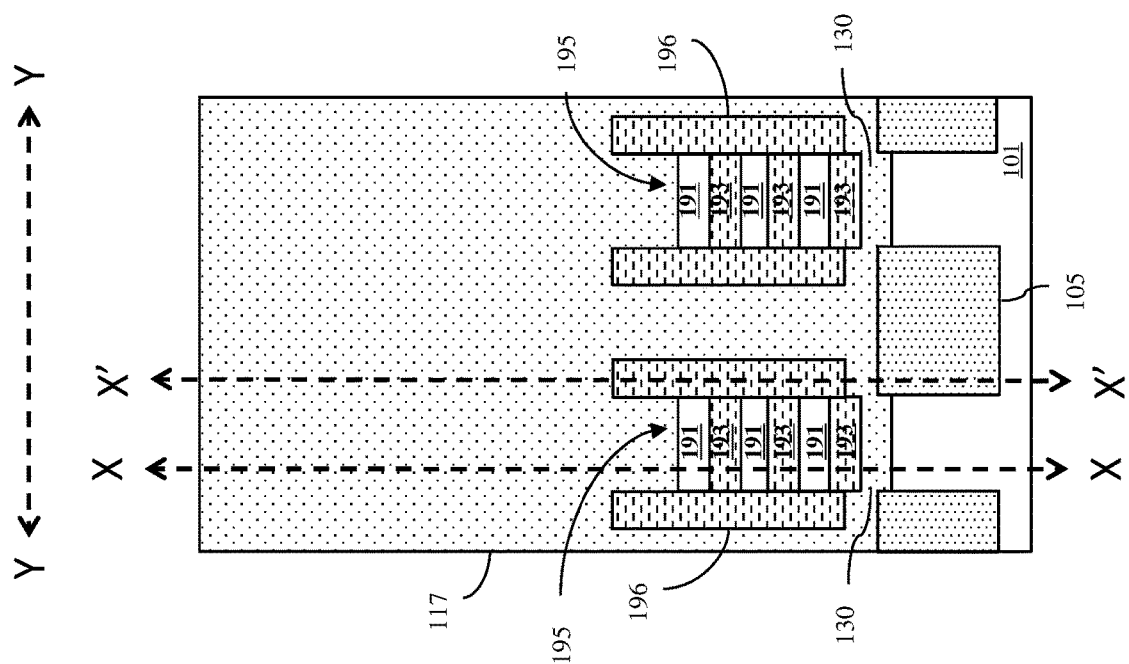
Figure 14D:
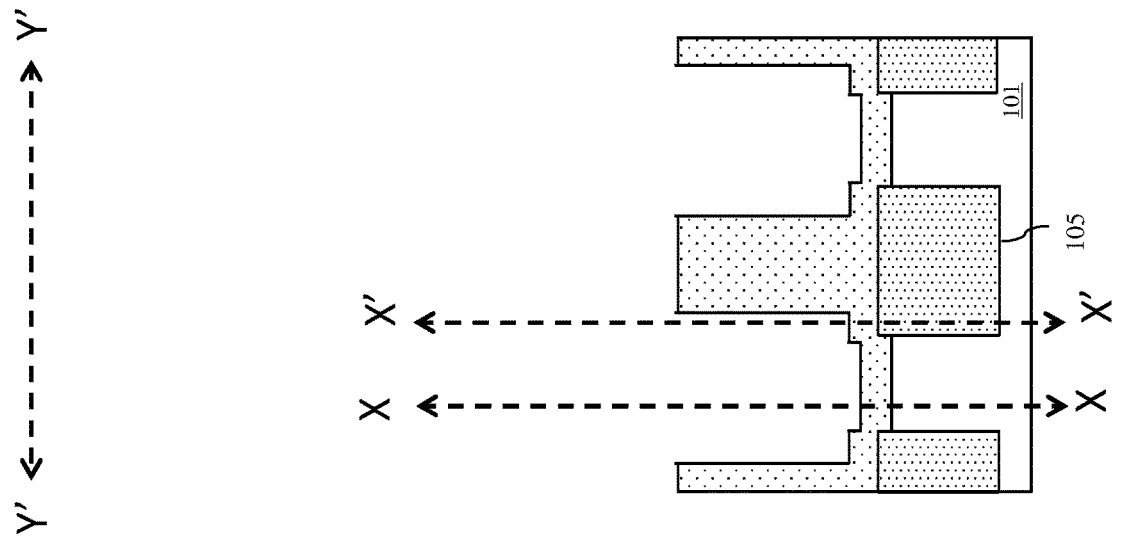
Figure 14C:
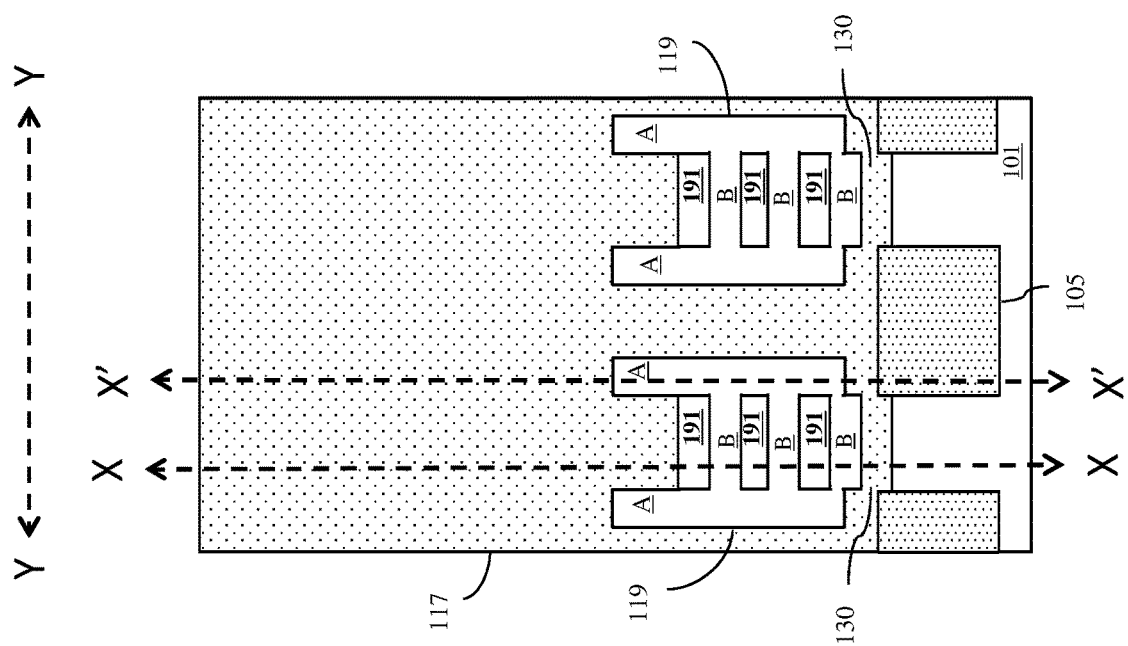
Figure 15D:
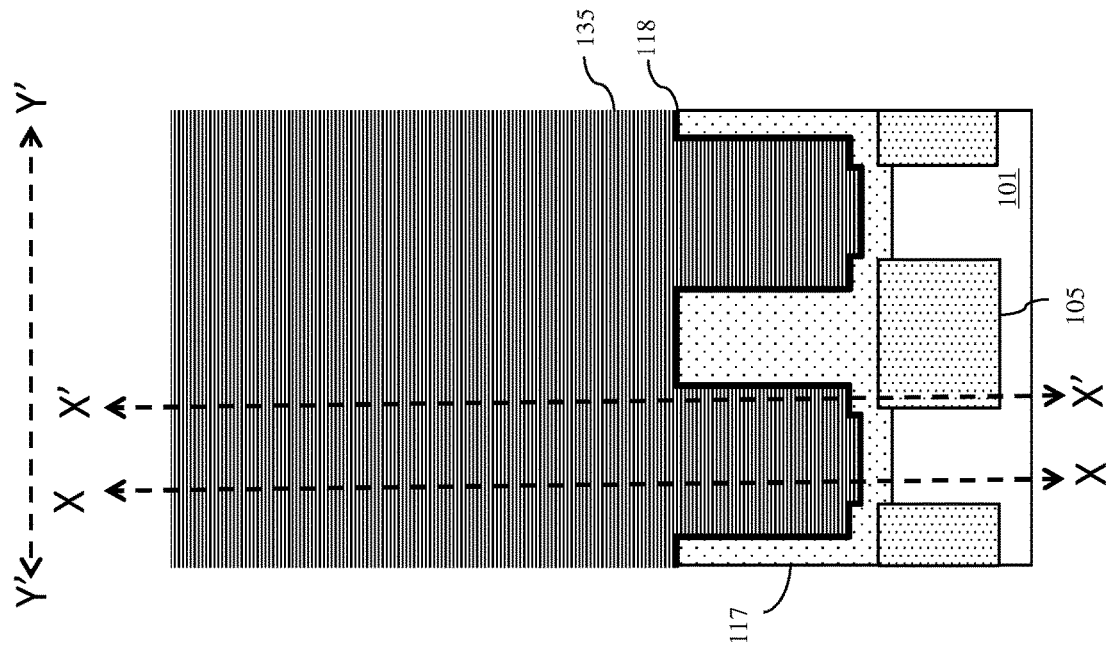
Figure 15C:
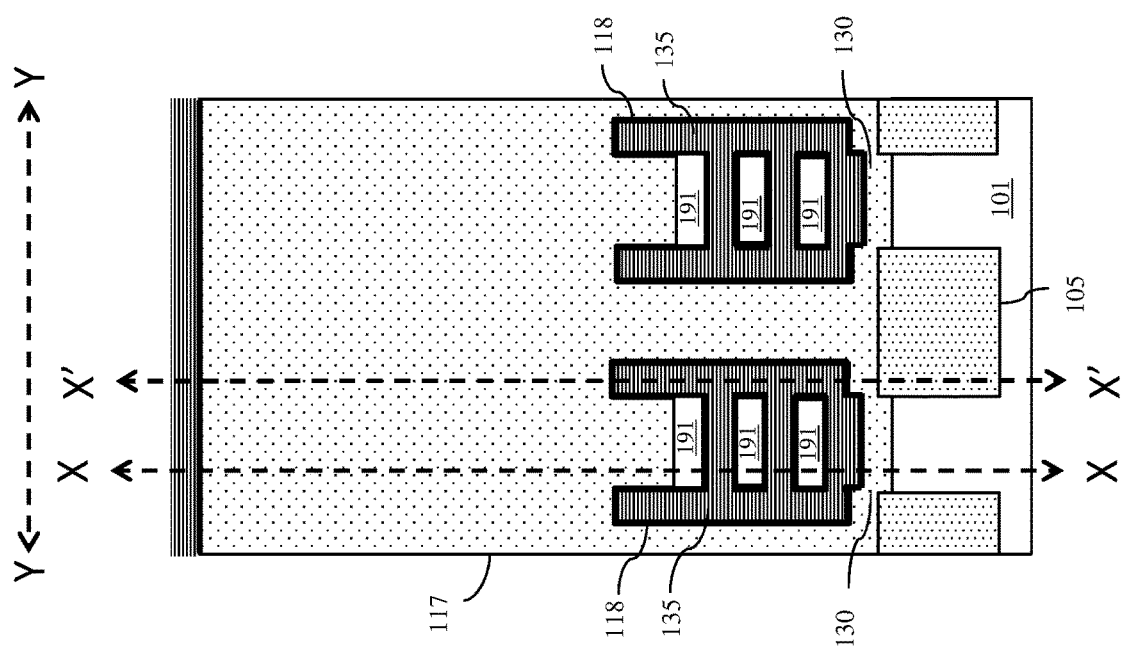
Figure 16D:
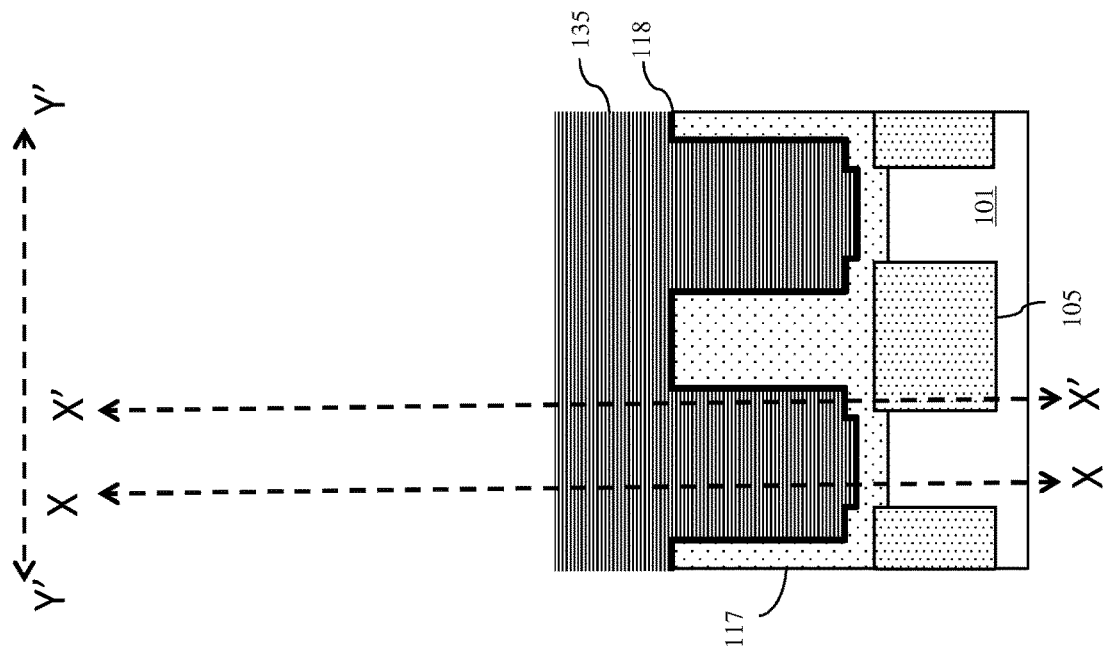
Figure 16C:
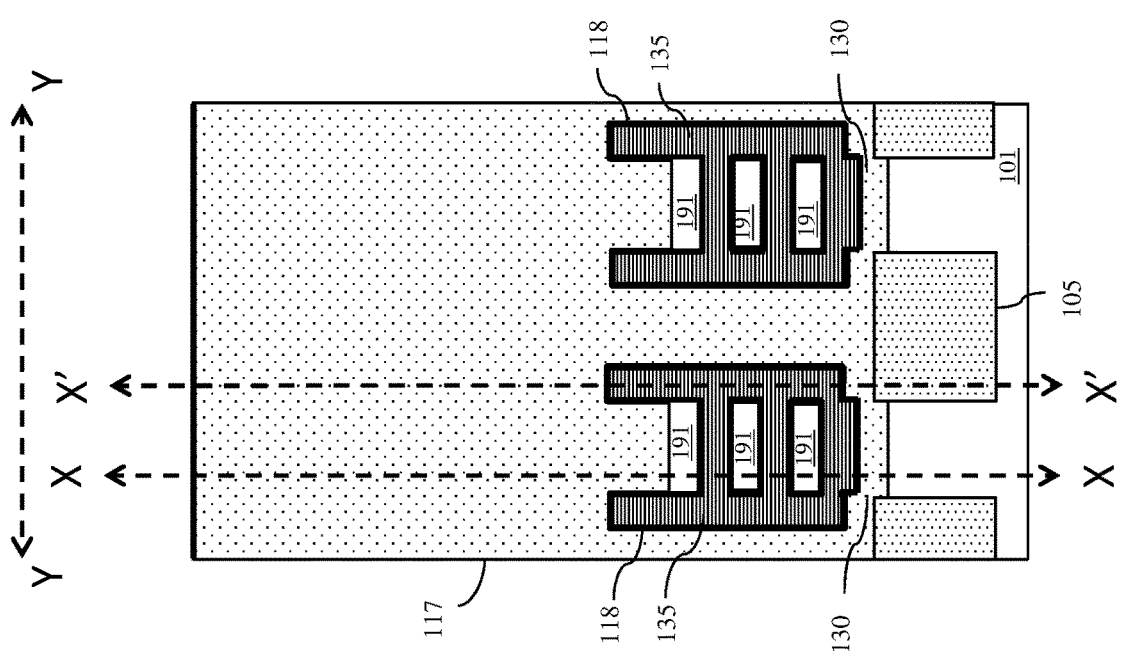

After the buried insulator cavity 197 is formed, a gate sidewall spacer 117 can be formed adjacent to external sidewalls of each sacrificial gate 180 and, during the process of forming the gate sidewall spacer 117, a buried insulator 130 can be concurrently formed in the buried insulator cavity 197 of each multi-layer body 195 (see process step 322 and FIGS. 11A-11D). Specifically, the gate sidewall spacer 117 can be formed using conventional gate sidewall spacer formation techniques. That is, a dielectric spacer material layer can be conformally deposited over the partially completed structure and then an anisotropic etch process can be performed to essentially remove the dielectric spacer material from horizontal surfaces. The remaining vertical portions of the dielectric spacer material layer on the sidewalls of each sacrificial gate 180 will form a gate sidewall spacer 117. The dielectric spacer material layer can be a second dielectric material that is different from the first dielectric material of the isolation region 105. For example, as mentioned above, the first dielectric material of the isolation region 105 can be silicon dioxide. The second dielectric material used for the gate sidewall spacer 117 can be, for example, silicon oxynitride, a low-K dielectric material, or any other suitable dielectric material that is different from the first dielectric material. For purposes of this disclosure, a "low-K dielectric material" refers to a dielectric material with a dielectric constant that is less than that of silicon nitride (i.e., less than 7). Exemplary low-K dielectric materials include, but are not limited to, carbon-doped silicon oxynitride (SiONC), silicon carbon nitride (SiCN), silicon oxycarbide (SiCO), and hydrogenated silicon oxycarbide (SiCOH). In any case, during this gate sidewall spacer formation process and, particularly, during conformal deposition of the dielectric spacer material layer, the dielectric spacer material can also be deposited into the previously created buried insulator cavity 197 within the multi-layer body, thereby forming a buried insulator 130 therein and, particularly, immediately below the lowermost layer 193 of the third semiconductor material within the multi-layer body 195. Those skilled in the art will recognize that, depending upon the pitch and width of the adjacent multi-layer bodies 195 and also on the thicknesses of the sacrificial sidewall spacer 196 and the gate sidewall spacer 117, the gate sidewall spacer 117 may completely cover the isolation region 105 between adjacent multi-layer bodies, as shown in FIG. 11D, or only partially cover the isolation region 105, as shown in FIG. 12.

Source/drain recesses 198 can then be formed in the second portions of each multi-layer body 195, which extend laterally beyond a sacrificial gate 180 (see process step 324 and FIGS. 13A-13D). Specifically, an anisotropic etch process can be performed, wherein the etch chemistries used are selective for the first semiconductor material of each multi-layer body 195 and the third semiconductor material of each multi-layer body 195 and the sacrificial sidewall spacer 196 thereon over the exposed dielectric materials of the gate sidewall spacer 117, the sacrificial gate cap 181, and the buried insulator 130. Thus, this etch process will completely remove the exposed portions of each multi-layer body 195 and the sacrificial sidewall spacer 196 thereon and will stop on the buried insulator 130. Additionally, as a result of this etch process, vertical surfaces of the remaining first portion of the multi-layer body 195 and the sacrificial sidewall spacer 196 thereon will be exposed within each source/drain recess 198 and essentially vertically aligned with the outermost edge of the gate sidewall spacer 117 above.

Next, the third semiconductor material, which is exposed at these vertical surfaces, is laterally etched to form inner spacer cavities 119 (see process step 326 and FIGS. 14A-14D). Specifically, the inner spacer cavities 119 will be formed at the sides of the source/drain recesses 198, respectively, aligned with the gate sidewall spacer 117. Given the structure of the sacrificial sidewall spacers and the multi-layer body, this lateral etch process will result in each inner spacer cavity 119 being adjacent to a corresponding one of the source/drain recesses 198, being above the buried insulator 130 and further being essentially ladder-shaped with a pair of vertical air-gap sections "A" within the gate sidewall spacer 117 and on opposing sides of the remaining first portion of the multi-layer body 195 at one end and with multiple stacked horizontal air-gap sections "B" that are below each layer 191 of the first semiconductor material at the same end and that extend laterally between the vertical air-gap sections "A". To form the inner spacer cavities 119, an isotropic etch process that is selective for the third semiconductor material (e.g., SiGe35) of the multi-layer body 195 and the sacrificial sidewall spacer 196 over the first semiconductor material (e.g., silicon) and over any exposed dielectric materials can be performed to etch back the exposed vertical surfaces of the third semiconductor material only of the layers 193 and the sacrificial sidewall spacer 196, thereby creating the inner spacer cavities 119.

Once the inner spacer cavities 119 are formed, a thin conformal dielectric liner 118 can be deposited so as to line the inner spacer cavities 119 (see process step 328 and FIGS. 15A-15D). The conformal dielectric liner 118 can be, for example, silicon nitride and approximately 2 nm thick. Next, a blanket layer of sacrificial fill material 135 can be deposited so as to fill the inner spacer cavities and cover the partially completed structure (see process step 330 and FIGS. 15A-15D). The sacrificial fill material 135 can be preselected to that it can be selectively and isotropically etched away during subsequent processing. For example, the sacrificial fill material 135 could be titanium dioxide, aluminum oxide, amorphous germanium or any other suitable sacrificial fill material 135 that can be selectively and isotropically etched away during subsequent processing as discussed in greater detail below at process step 336.

Figure 17D:
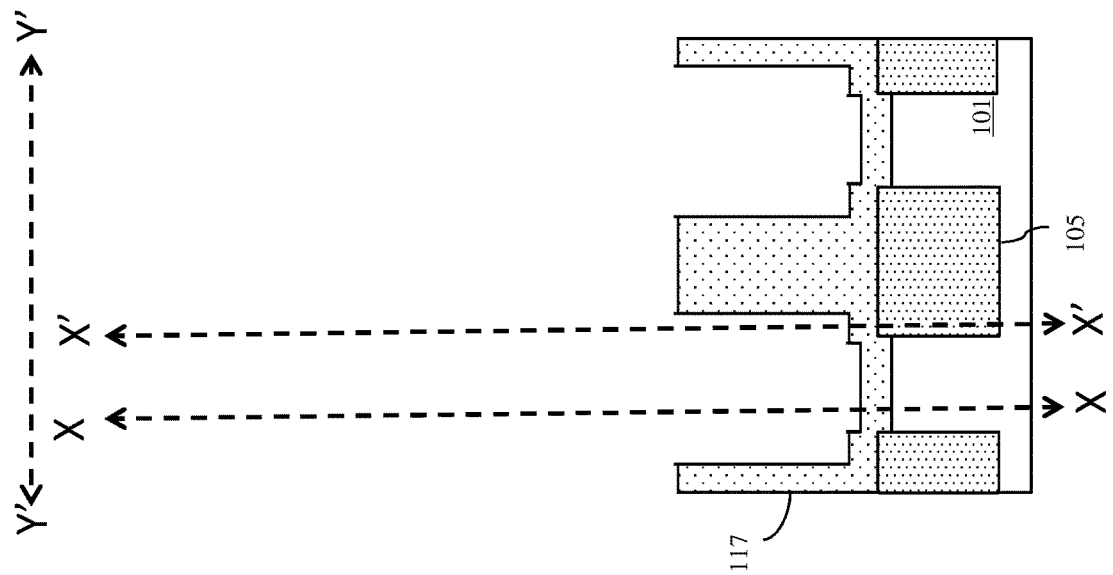
Figure 17C:
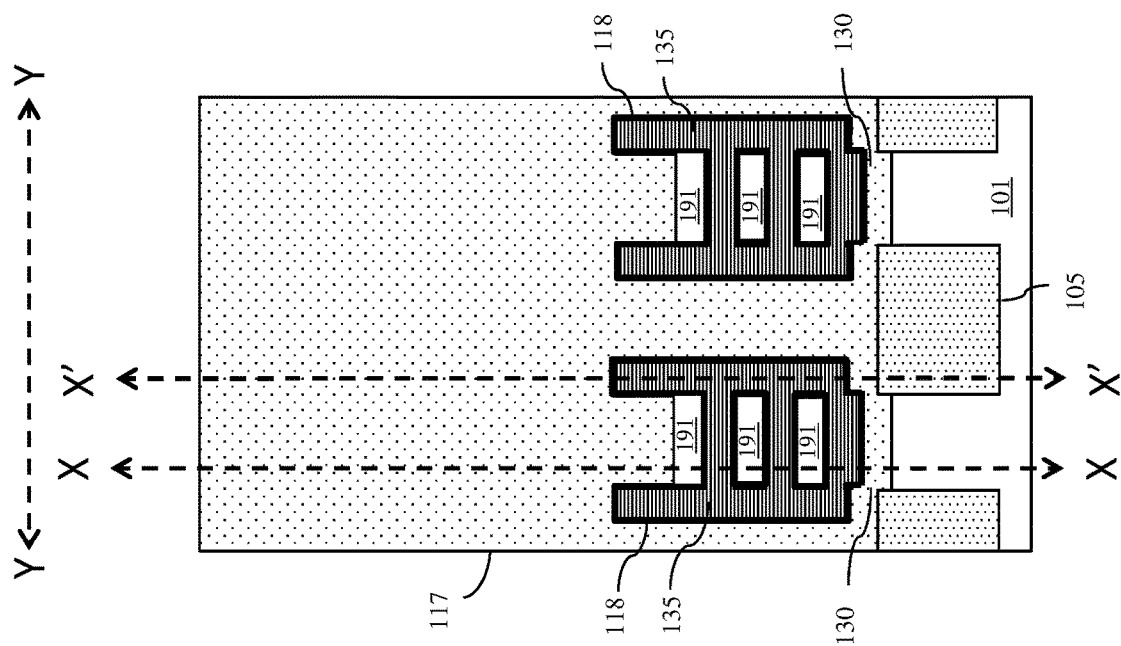
Figure 18D:
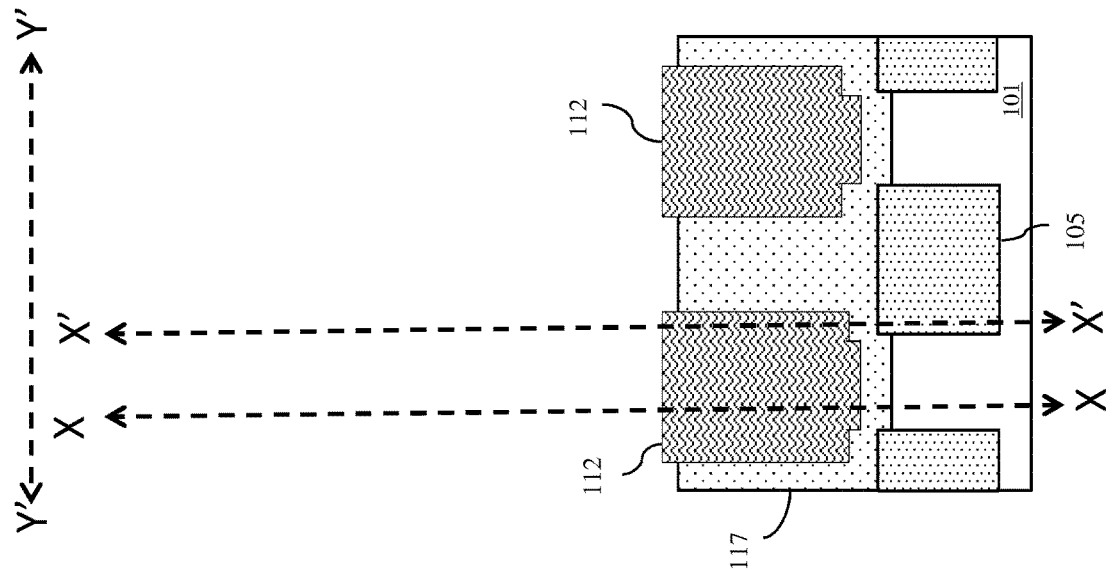
Figure 18C:
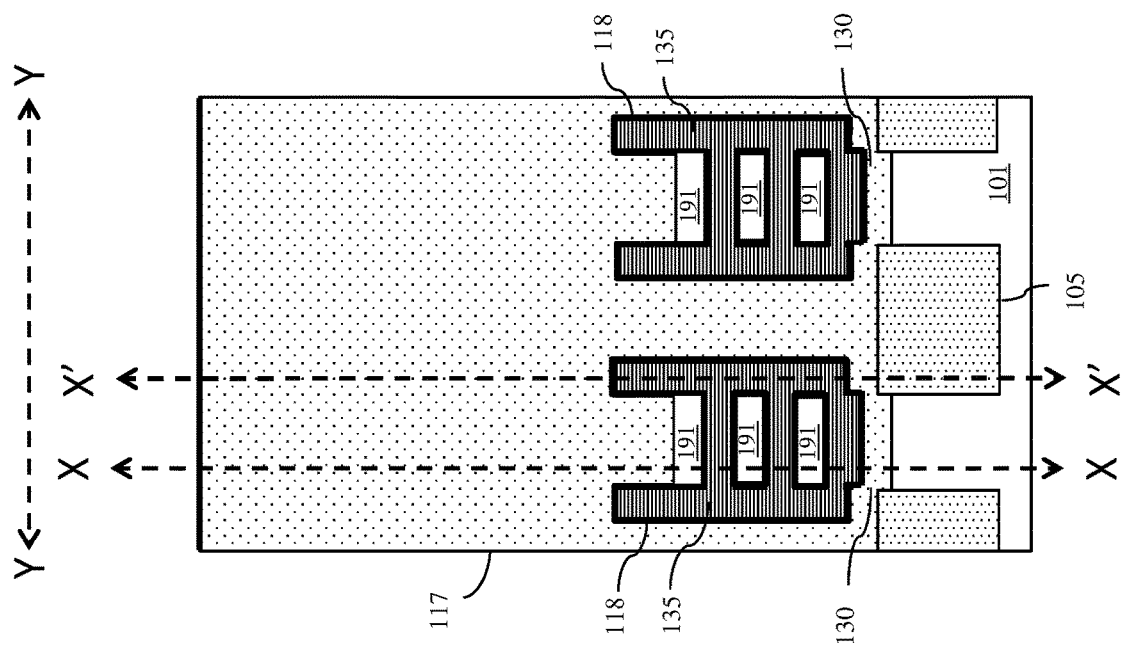
Figure 19D:
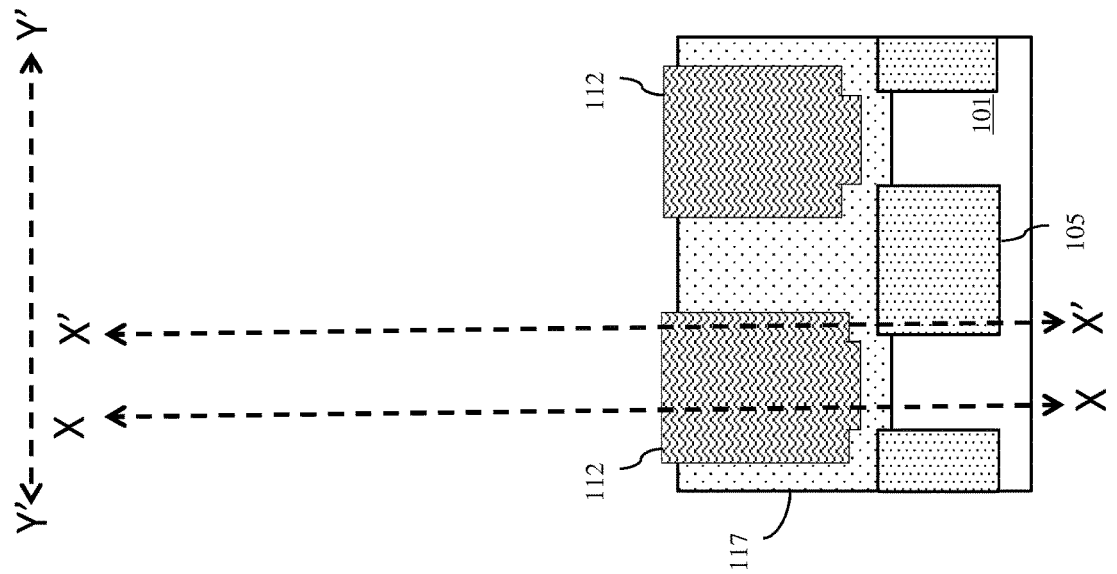
Figure 19C:
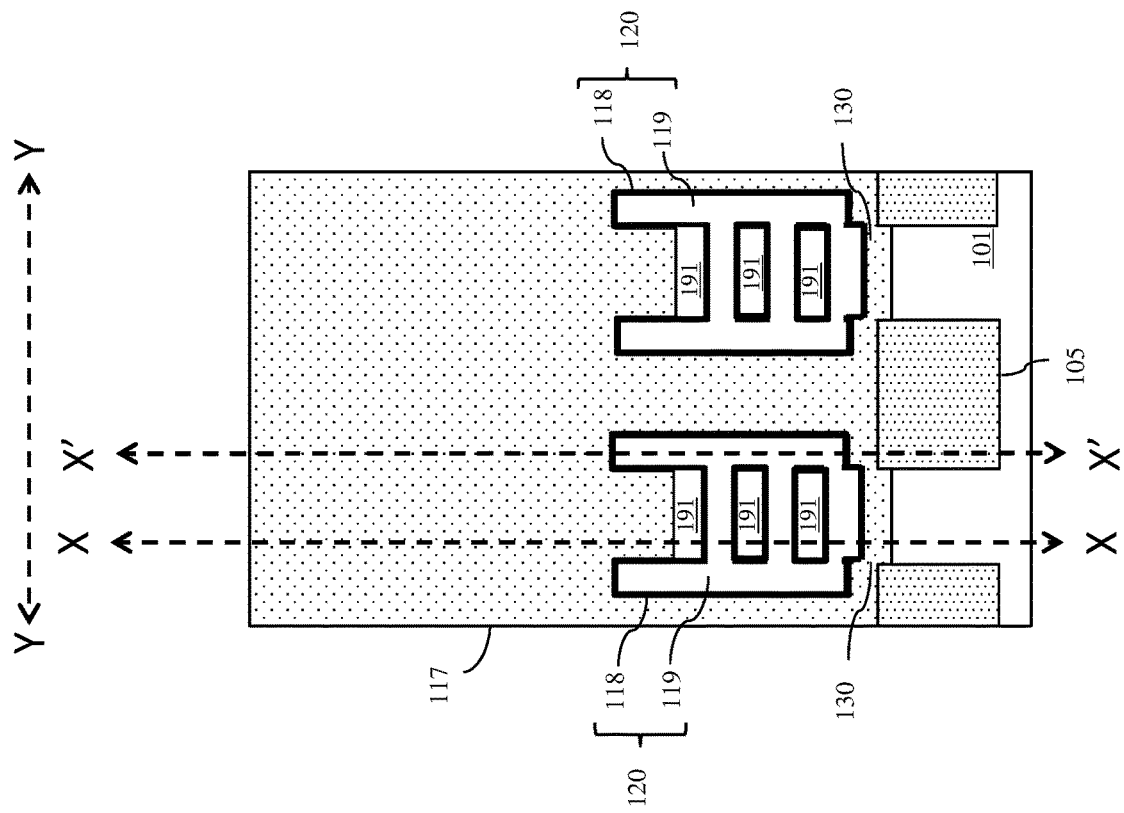
Figure 20D:
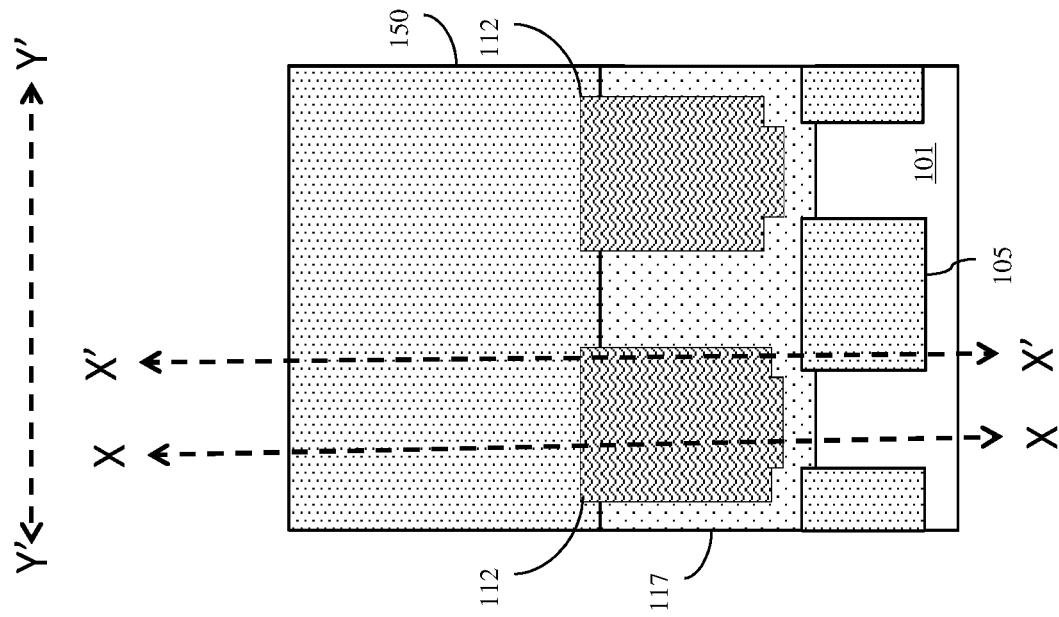
Figure 20C:
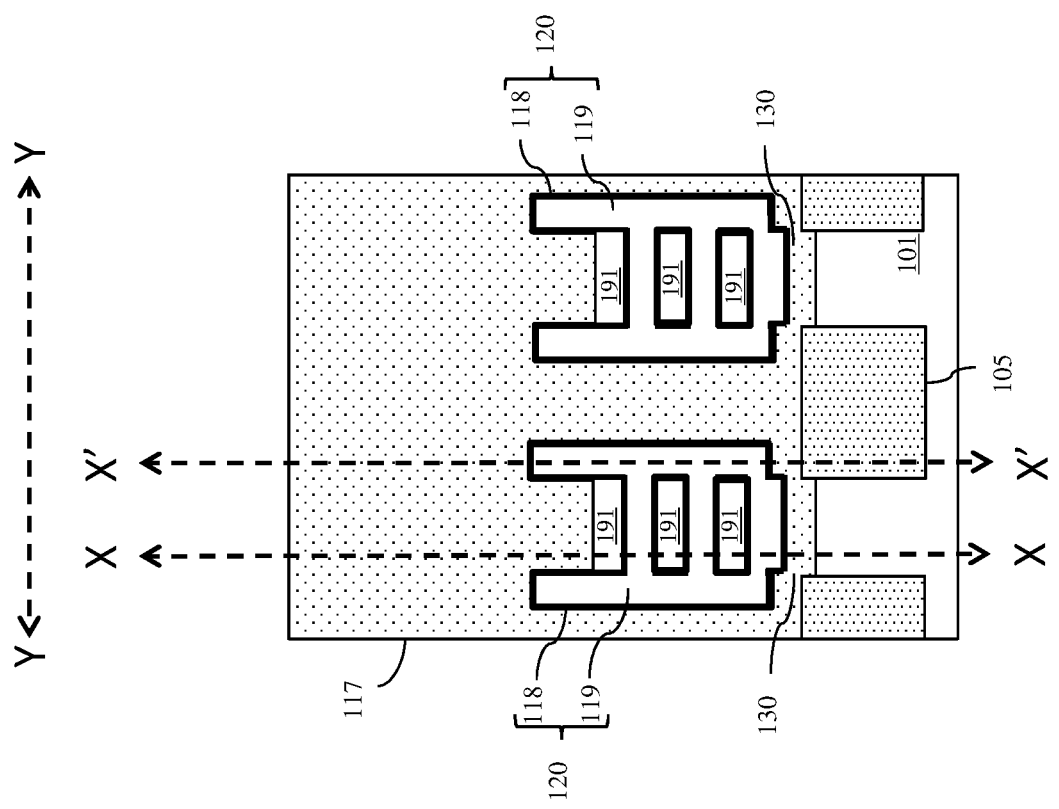

Next, one or more etch processes can be performed so as to remove any of the sacrificial fill material 135 and material of the dielectric liner 118 that has been deposited outside the inner spacer cavities 119 (see process step 332 and FIGS. 16A-16D and 17A-17D). For example, a selective isotropic etch process (e.g., a selective wet etch process) can be performed in order to partially recess the sacrificial fill material 135 (see FIGS. 16A-16D) and, particularly, to recesses the sacrificial fill material 135 such that the top surface of the sacrificial fill material 135 is just above the tops of the vertical air-gap sections "A" of the inner spacer cavities 119 (e.g., see FIG. 16B). Next, a selective anisotropic etch process (e.g., a selective dry etch process) can be performed, using the sacrificial gate and gate sidewall spacer thereon as a mask, to remove any remaining portion of the sacrificial fill material 135 outside the inner spacer cavities 119 and particularly to form a trench in the sacrificial fill material 135 that extends to the buried insulator 130, thereby ensuring that the sacrificial fill material 135 does not extend laterally outside the inner spacer cavities (i.e., beyond the gate sidewall spacers 117) (see FIGS. 17A-17D). Another selective isotropic etch process can then be performed so as to remove exposed portions of the dielectric liner 118 (see FIGS. 17A-17D). As illustrated in FIG. 17A, removal of the exposed dielectric liner material will expose essentially vertical surfaces of the layers 191 of the first semiconductor material within the source/drain recesses 198 and will ensure that, on either side of the sacrificial gate 180, essentially vertical surfaces of the layer 191 of the first semiconductor material, the sacrificial fill material 135 and the gate sidewall spacer 117 will be substantially vertically aligned.

Source/drain regions 112 can subsequently be formed on the buried insulator 130 in the source/drain recesses 198 (see process step 334 and FIGS. 18A-18D). The source/drain regions 112 can be formed, for example, by epitaxially growing a semiconductor material on the exposed vertical surfaces of the layers 191 of the first semiconductor material within the source/drain recesses 198. The semiconductor material, which is epitaxially grown in the source/drain recesses 198 can be the first semiconductor material (e.g., monocrystalline silicon) or some other suitable monocrystalline semiconductor material, which is preselected, for example, to improve channel mobility depending upon the GAAFET conductivity type. Additionally, those skilled in the art will recognize that the source/drain regions 112 can be in situ doped and the conductivity type of the dopant used will vary depending upon whether the GAAFETs are to be P-type (i.e., PFETs) or N-type (i.e., NFETs). That is, for PFETs, the semiconductor material of the source/drain regions 112 can be in situ doped so as to have P-type conductivity at a relatively high conductivity level (i.e., P+ conductivity); whereas, for NFETs, the semiconductor material of the source/drain regions 112 can be in situ doped so as to have N-type conductivity at a relatively high conductivity level (i.e., N+ conductivity). In any case, the source/drain regions 112 should be formed such that at least an upper portion of the sacrificial fill material 135 within the vertical air-gap sections "A" of each inner spacer cavity 119 is exposed (i.e., such that the top surfaces of the source/drain regions 112 are below the level of the tops of the vertical air-gap sections "A" of the inner spacer cavities 119, thereby providing openings 145 to the inner spacer cavities 119, as shown specifically in FIG. 18B).

After the source/drain regions are formed, the sacrificial fill material 135 can be selectively removed from the inner spacer cavities 135 through the openings 145 (see process step 336 and FIGS. 19A-19D). Removal of the sacrificial fill material 135 can be performed using a selective isotropic etch process (e.g., a selective wet etch process).

Figure 21:
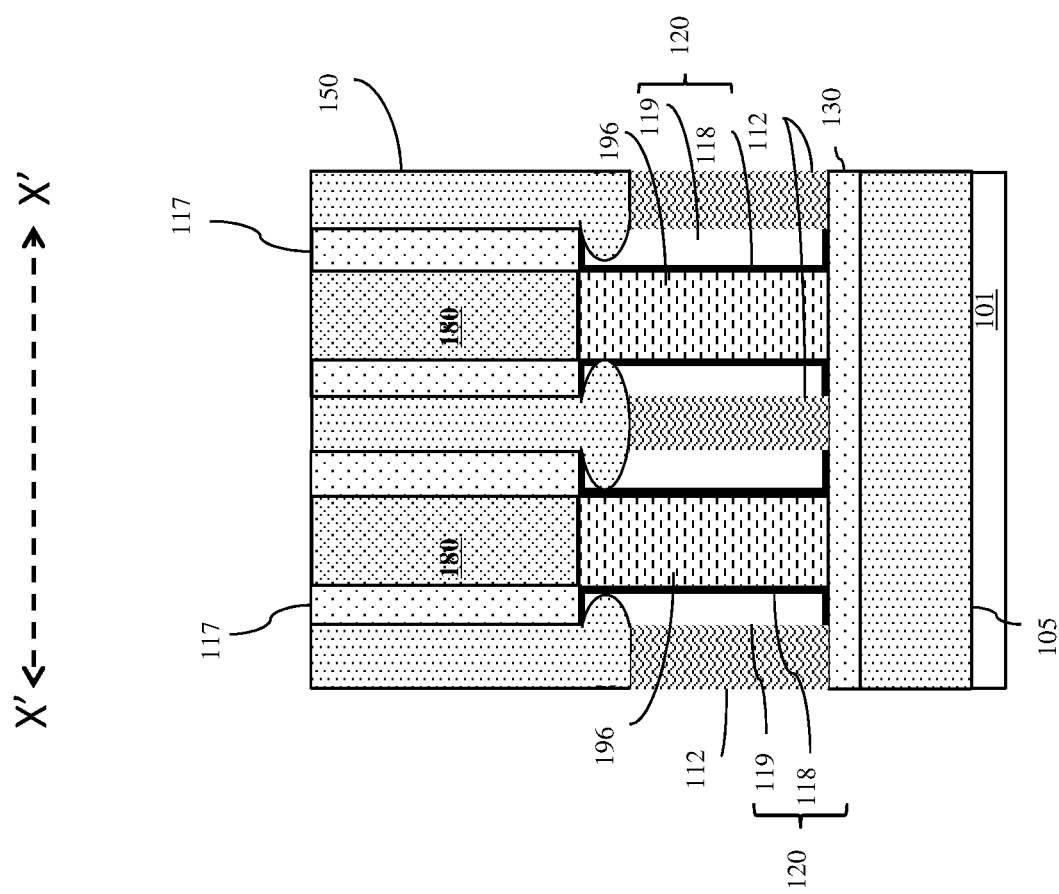
FIG. 21 is a cross-section diagram of an alternative structure to that shown in FIG. 20B.

Once the sacrificial fill material 135 is removed, interlayer dielectric material (ILD) 150 can be deposited to seal off the inner spacer cavities 119 at the openings 145 such that the air-gap inner spacers 120 are formed (see process step 338 and FIGS. 20A-20D). The ILD material can be the first dielectric material (e.g., silicon dioxide) or any other suitable dielectric material that is different from the dielectric materials of the gate sidewall spacer 117 and the sacrificial gate cap 181 on each sacrificial gate 180. The ILD material can be deposited, for example, using a directional deposition processes (e.g., a high density plasma chemical vapor deposition (HDPCVD) process) to ensure that the ILD material is only deposited on the horizontal top surfaces of the source/drain regions 112 and does not enter the inner spacer cavities 119, as illustrated in FIG. 20. Optionally, once the openings 145 are sealed off, deposition of the ILD material 150 can be completed using a non-directional chemical vapor deposition process (e.g., a low pressure chemical vapor deposition (LPCVD) process). Alternatively, the ILD material 150 can be deposited using a non-directional CVD process. In this case, as illustrated in the alternative cross-section XX shown in FIG. 21, given the size of the openings 145 and the aspect ratio of the vertical air-gap sections "A" of the inner spacer cavities 119, the ILD material will pinch off at the tops of the vertical air-gap sections "A" such that the resulting inner spacer is still an air-gap inner spacer.

As illustrated in FIGS. 20A-20D (and in the alternatively in FIG. 21), since the sacrificial fill material 135 is not removed from the inner spacer cavities 119 until after the source/drain regions 112 are formed, there is no chance of the source/drain material growing inside the inner spacer cavities 119. Thus, the proximal side of each source/drain region 112 (i.e., a side closest to the sacrificial gate 180) will abut the ends of the layers 191 and will be essentially vertical (i.e., planar and essentially perpendicular to the top surface of the buried insulator 130).

Following deposition of the ILD material 150, a polishing process (e.g., a chemical mechanical polishing (CMP) process) can be performed to expose the top surface of each sacrificial gate 180. As illustrated, this CMP process will effectively remove the sacrificial gate cap 181 on each sacrificial gate 180.

Additional processing can then be performed in order to complete the semiconductor GAAFETs 110a-110d (see process steps 340-346 and FIGS. 1A-1D).

Specifically, the sacrificial gates 180 of the GAAFETs 110a-110d can be selectively removed, thereby creating gate openings (see process step 340). That is, a selective etch process can be performed to selectively etch away the material of the sacrificial gate layer over the semiconductor materials of each multi-layer body 195 and the sacrificial sidewall spacer 196 adjacent thereto (i.e., over the first semiconductor material and the third semiconductor material) and also over the dielectric materials of the gate sidewall spacer 117 on each sacrificial gate and the dielectric liner 118 lining each cavity 119, thereby creating gate openings that expose the remaining first portions of each multi-layer body 195 and the sacrificial sidewall spacer 196 adjacent thereto. As mentioned above, formation of the sacrificial gates 180 typically includes deposition of a thin conformal dielectric layer (e.g., a thin conformal silicon dioxide layer) prior to deposition and patterning of the sacrificial gate material. This thin conformal dielectric layer will protect the semiconductor materials during removal of the sacrificial gates 180. Following removal of the sacrificial gates 180, this conformal dielectric layer can also be removed from the gate opening (e.g., by buffered hydrofluoric acid (BHF) in the case of a silicon dioxide layer).

Exposed third dielectric material of the multi-layer body 195 and of the sacrificial sidewall spacer 196 within the gate openings can be selectively etched away (see process step 342). For example, if the first semiconductor material of the layers 191 within the multi-layer bodies 195 is silicon and the third semiconductor material of the layers 193 within the multi-layer bodies 195 and within the sacrificial sidewall spacers 196 is silicon germanium (e.g., SiGe35), then the silicon germanium can be selectively etched over the silicon as well as the dielectric materials of the gate sidewall spacers 117 using any of the following exemplary processes: a thermal etch process (e.g., using gaseous hydrochloric acid (HCl)), a dry plasma etch process, or a wet etch process with process specifications designed to ensure the selective etch of silicon germanium over silicon and various dielectric materials. Alternatively, any other suitable isotropic selective etch process that selectively etches silicon germanium could be used.

As a result of process step 342, a stack 199 of discrete elongated monocrystalline semiconductor nanoshapes 111 (e.g., silicon nanoshapes) are formed. These nanoshapes 111 correspond to the remaining portions of the layers 191 of the first semiconductor material and the stack 199 will include multiple parallel nanoshapes 111, which are stacked one above the other and which are physically separated. The number of nanoshapes 111 in the stack 199 will depend upon the number of layers 191 of the first semiconductor material formed at process step 304. Additionally, the widths and heights of these nanoshapes 111 will vary depending upon the thicknesses of the layers 191 formed at process step 304 and also the widths of the multi-layer bodies 195 patterned at process step 308. Thus, the resulting nanoshapes 111 may be either nanowires or nanosheets, as defined above.

Replacement metal gates (RMGs) 115 can then be formed in the gate openings (see process step 344). Each RMG 115 can be formed above and immediately adjacent to the buried insulator 130 and further formed so as to wrap around (i.e., so as to be adjacent to the top, bottom and side surfaces) of the center portion of each nanoshape 111. These RMGs can be formed using conventional RMG formation techniques. That is, a gate dielectric layer (e.g., a high-K gate dielectric layer) can be conformally deposited so that the exposed surfaces of the nanoshape(s) within gate openings are covered (i.e., so that the gate dielectric layer wraps completely around each nanoshape within each gate opening). Those skilled in the art will recognize that, due to the conformal deposition process, the gate dielectric layer may also cover other exposed surfaces within the gate opening (e.g., exposed surfaces of gate sidewall spacers 117 and the buried insulator 130). One or more gate conductor layers can then be deposited so as to fill the gate openings. For example, a work function metal layer can be conformally deposited in the gate openings. The metal material or metal alloy material of the work function metal layer can be preselected in order to achieve the optimal gate conductor work function given the conductivity type of the transistors for which the RMGs are being formed. The work function metal layer can then, optionally, be chamfered. The chamfering process can include: depositing a protective fill material onto the work function metal layer; recessing the protective fill material; etching away the exposed work function metal material from above the protective fill material such that the maximum height of the work function metal layer is below the level of the top surface of the gate sidewall spacer; and removing the protective fill material. Finally, a conductive fill material can be deposited to fill any remaining space in the gate opening and a polishing process (e.g., a CMP process) can be performed to remove any RMG materials from above the top surface of the ILD material 150.

It should be noted that the integrity of the air-gap inner spacers 120 will be maintained by the dielectric liner 118 during the sacrificial gate removal at process step 340, during nanoshape formation at process step 342 and during RMG formation at process step 344. That is, the etch processes used to remove the sacrificial gate and form the nanoshapes will be selective such that etching of the dielectric liner is avoided and, thus, the RMG materials will not be deposited into the inner spacer cavities 119.

Next, dielectric gate caps 116 can be formed on the top surfaces of the RMGs 115. For example, the conductive fill material within the gate openings can be recessed (i.e., etched back) and a dielectric cap layer (e.g., a silicon nitride cap layer) can be deposited over the partially completed structure. A polishing process (e.g., a CMP process) can be performed so as to remove any of the dielectric cap material from above the top surface of the ILD material 150 thereby forming the dielectric gate caps 116.

Additional processing can be performed in order to complete the semiconductor structure (see process step 346). This additional processing can include, but is not limited to, formation of metal plugs on the source/drain regions, formation of middle of the line (MOL) contacts to the RMGs and the metal plugs, formation of back end of the line (BEOL) wiring, etc.

The above-described methods avoid the above-mentioned problems associated with device size scaling and the formation of inner spacers. For example, as mentioned above, there is a 3 nm space requirement for properly performing a wet etch process. In an embodiment of the method where the gate pitch is reduced to 42 nm, the gate length is reduced to 18 nm, and the gate sidewall spacer is 7 nm thick, there will be an open space of 15 nm between adjacent sacrificial gates 180 before the 2 nm dielectric liner 118 and the sacrificial fill material 135 are deposited so as to fill the inner spacer cavities 119 (and the open space between the sacrificial gates 180) at process steps 328 and 330. However, at process step 332, a selective isotropic etch process (e.g., a selective wet etch process) is performed in order to only partially recess the sacrificial fill material 135, thereby opening the space up again to 11 nm (see FIGS. 16A-16D). Then, a selective anisotropic etch process (e.g., a selective dry etch process) is performed to form a trench in the sacrificial fill material 135 down to the buried insulator and another selective isotropic etch process is performed to remove exposed portions of the dielectric liner 118 and, thereby expand the open space between the sacrificial gates 180 back up to 15 nm (see FIGS. 17A-17D). When the sacrificial fill material 135 is subsequently removed from the inner spacer cavities 119 at process step 336 using a selective isotropic etch process (e.g., a selective wet etch process), the open space between the sacrificial gates 180 is still 15 nm (not 0.6 nm as in the prior art). Thus, the 3 nm space requirement for properly performing a wet etch process is met. Additionally, since the dielectric constant (K) of air is approximately 1 and, thus, significantly less than typical spacer materials and since the air-gap inner spacers 120 are located not only below each nanoshape 111 but also on the sides thereof, the air-gap inner spacers provide significantly reduced gate-to-source/drain region capacitance.

Those skilled in the art will recognize that in the methods and structures described above different dopants can be used to achieve the different conductivity types and that the dopants may vary depending upon the different semiconductor materials used. For example, a silicon-based semiconductor material (e.g., silicon, silicon germanium, etc.) having P-type conductivity is typically doped with a P-type dopant (e.g., a Group III dopant, such as boron (B) or indium (In)), whereas a silicon-based semiconductor material having N-type conductivity is typically doped with an N-type dopant (e.g., a Group V dopant, such as arsenic (As), phosphorous (P) or antimony (Sb)). Those skilled in the art will also recognize that different conductivity levels will depend upon the relative concentration levels of the dopants. Additionally, the RMGs 115 can have the same gate conductor materials regardless of whether the GAAFETs are PFETs or NFETs. Alternatively, for NFETs, the RMGs 115 can have a first work function, whereas, for PFETs, the RMGs can have a second work function that is different from the first work function. Specifically, the RMGs can have a high-K gate dielectric layer. Those skilled in the art will recognize that a high-K gate dielectric layer refers to a gate dielectric layer made of a dielectric material with a dielectric constant that is greater than the dielectric constant of silicon nitride (i.e., greater 7). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The optimal gate conductor work function of NFETs can be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for PFETs can be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Any conductive fill material used can be a fill metal or fill metal alloy, such as tungsten, a tungsten alloy (e.g., tungsten silicide or titanium tungsten), cobalt, aluminum or any other suitable fill metal or fill metal alloy.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "second", "first", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A semiconductor structure comprising:
a semiconductor substrate; and
a transistor on the substrate, the transistor comprising:
source/drain regions;

a stack of semiconductor nanoshapes extending laterally between the source/drain regions;

a gate wrapping around a center portion of each nanoshape;

a gate sidewall spacer positioned laterally adjacent to external sidewalls of the gate, wherein end portions of each nanoshape extend laterally beyond internal sidewalls of the gate through the gate sidewall spacer to the source/drain regions; and air-gap inner spacers, wherein each air-gap inner spacer comprises:

a pair of vertical air-gap sections within the gate sidewall spacer on opposing sides of the stack at an end adjacent to a source/drain region; and horizontal air-gap sections below the nanoshapes, respectively, and extending laterally between the pair of vertical air-gap sections, wherein the horizontal air-gap sections are between the source/drain region and an internal sidewall of the gate.

2. The semiconductor structure of claim 1, wherein the nanoshapes comprise any of nanowires and nanosheets.

3. The semiconductor structure of claim 1, wherein each air-gap inner spacer comprises an inner spacer cavity and a dielectric liner that lines surfaces of the nanoshapes, the gate, and the gate sidewall spacer within the inner spacer cavity.

4. The semiconductor structure of claim 3, wherein the dielectric liner comprises silicon nitride.

5. The semiconductor structure of claim 1, wherein tops of the vertical air-gap sections of each air-gap inner spacer are above a level of a top surface of an uppermost nanoshape in the stack and further above a level of top surfaces of the source/drain regions.

6. The semiconductor structure of claim 1, wherein a proximal side of each source/drain region abutting the nanoshapes is essentially planar.

7. The semiconductor structure of claim 1, further comprising a buried insulator between the semiconductor substrate and the transistor, wherein the source/drain regions and the gate are above and immediately adjacent to the buried insulator.

* * * * *